(12) United States Patent
Kim et al.

(10) Patent No.: US 11,569,793 B2
(45) Date of Patent: Jan. 31, 2023

(54) ACOUSTIC RESONATOR

(71) Applicant: Samsung Electro-Mechanics., Co., Ltd., Suwon-si (KR)

(72) Inventors: Tae Yoon Kim, Suwon-si (KR); Jong Woon Kim, Suwon-si (KR); Dae Hun Jeong, Suwon-si (KR); Moon Chul Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 629 days.

(21) Appl. No.: 16/692,142

(22) Filed: Nov. 22, 2019

(65) Prior Publication Data

US 2020/0204147 A1 Jun. 25, 2020

Related U.S. Application Data

(63) Continuation-in-part of application No. 16/441,599, filed on Jun. 14, 2019.

(30) Foreign Application Priority Data

Dec. 19, 2018 (KR) .................. 10-2018-0165540
Mar. 19, 2019 (KR) .................. 10-2019-0030936
Sep. 5, 2019 (KR) .................. 10-2019-0110201

(51) Int. Cl.
*H03H 9/02* (2006.01)
*H01L 41/047* (2006.01)
(Continued)

(52) U.S. Cl.
CPC ....... *H03H 9/02086* (2013.01); *H01L 41/047* (2013.01); *H03H 9/132* (2013.01); *H03H 9/15* (2013.01)

(58) Field of Classification Search
CPC ...... H03H 9/02086; H03H 9/132; H03H 9/15; H01L 41/047
See application file for complete search history.

(56) References Cited

U.S. PATENT DOCUMENTS 9,136,818 B2 9/2015 Burak et al.
9,444,428 B2 9/2016 Ruby et al.
(Continued)

FOREIGN PATENT DOCUMENTS

JP 2009-124640 A 6/2009
KR 10-2018-0101129 A 9/2018

OTHER PUBLICATIONS

Korean Office Action dated Nov. 19, 2020 in counterpart Korean Patent Application No. 10-2019-0110201 (7 pages in English, 5 pages in Korean).
(Continued)

*Primary Examiner* — Bryan P Gordon
(74) *Attorney, Agent, or Firm* — NSIP Law

(57) ABSTRACT

An acoustic resonator includes: a resonating unit including a resonating unit including a piezoelectric layer and first and second electrodes disposed on a lower side and an upper side of the piezoelectric layer, respectively; a substrate disposed on a lower side of the resonating unit; a support unit providing a cavity between the substrate and the resonating unit; and an intermediate metal layer separated from the second electrode and disposed in the resonating unit such that at least a portion thereof is surrounded by the piezoelectric layer and the second electrode.

21 Claims, 53 Drawing Sheets

(51) Int. Cl.
*H03H 9/15* (2006.01)
*H03H 9/13* (2006.01)

(56) References Cited

U.S. PATENT DOCUMENTS

| | | | |
|---|---|---|---|
| 2008/0024041 A1* | 1/2008 | Shibata | H03H 9/105 |
| | | | 29/25.35 |
| 2008/0061907 A1* | 3/2008 | Lee | H03H 3/02 |
| | | | 333/191 |
| 2009/0127978 A1 | 5/2009 | Asai et al. | |
| 2014/0232244 A1* | 8/2014 | Sridaran | H03H 9/08 |
| | | | 310/343 |
| 2017/0244021 A1 | 8/2017 | Han et al. | |
| 2017/0338799 A1* | 11/2017 | Ruby | H03H 9/171 |
| 2018/0054176 A1* | 2/2018 | Kim | H03H 9/547 |
| 2018/0219528 A1* | 8/2018 | Liu | H03H 9/131 |
| 2018/0254764 A1 | 9/2018 | Lee et al. | |

OTHER PUBLICATIONS

Korean Office Action dated May 29, 2020 in the corresponding Korean Patent Application No. 10-2019-0030936 (3 pages in English, 3 pages in Korean).

U.S. Office Action dated May 24, 2022 in corresponding U.S. Appl. No. 16/441,599.

\* cited by examiner

ACOUSTIC RESONATOR

CROSS-REFERENCE TO RELATED APPLICATIONS

This application is a continuation-in-part of U.S. application Ser. No. 16/441,599 filed on Jun. 14, 2019, which claims the benefit of Korean Patent Application Nos. 10-2018-0165540 and 10-2019-0030936 filed on Dec. 19, 2018 and Mar. 19, 2019, respectively, in the Korean Intellectual Property Office, and this application additionally claims the benefit of Korean Patent Application No. 10-2019-0110201 filed on Sep. 5, 2019 in the Korean Intellectual Property Office, the entire disclosures of which are incorporated herein by reference for all purposes.

BACKGROUND

1. Field

The following disclosure relates to an acoustic resonator.

2. Description of Related Art

With the recent rapid development of mobile communication devices, chemical and biological devices, and the like, a demand for a small and lightweight filter, an oscillator, a resonant element, an acoustic resonant mass sensor, and the like, used in such devices, is increasing. The acoustic resonator may be configured as a means for implementing such a small and lightweight filter, an oscillator, a resonant element, an acoustic resonant mass sensor, and the like, and may be implemented as a thin bulk acoustic resonator (FBAR).

FBARs may be mass-produced at a minimal cost, and may be implemented to have a subminiature size. In addition, the FBAR may implement a high quality factor (QF) value, which is a main characteristic of a filter, and may be used even in a microwave frequency band. Particularly, the FBAR may implement bands of a personal communication system (PCS) and a digital cordless system (DCS).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator includes: a resonating unit including a piezoelectric layer and first and second electrodes disposed on a lower side and an upper side of the piezoelectric layer, respectively; a substrate disposed on a lower side of the resonating unit; a support unit providing a cavity between the substrate and the resonating unit; and an intermediate metal layer separated from the second electrode and disposed in the resonating unit such that at least a portion thereof is surrounded by the piezoelectric layer and the second electrode.

The acoustic resonator may further include a pillar disposed on a lower side of the intermediate metal layer in the cavity and connecting between the resonating unit and the substrate.

The intermediate metal layer may be electrically connected to the first electrode.

The acoustic resonator may further include a first etch stop layer disposed between the support unit and the cavity. The pillar may include: a second etch stop layer disposed in the cavity and disposed between the resonating unit and the substrate; and a thermally conductive layer surrounded by the second etch stop layer and formed of a material different from that of the second etch stop layer.

The pillar may be configured such that a width of a lower surface thereof is larger than a width of an upper surface thereof.

The resonating unit may further include a metal insertion layer disposed on a lower side of the intermediate metal layer and disposed between the pillar and the first electrode.

The intermediate metal layer may have a thickness thicker than a thickness of the second electrode.

An interface between the intermediate metal layer and the piezoelectric layer may be oblique to the first electrode.

The resonating unit may further include a first insertion layer in which at least a portion thereof is positioned between the intermediate metal layer and the first electrode.

The resonating unit may further include a first insertion layer surrounding at least a portion of the intermediate metal layer on an upper side of the piezoelectric layer.

The resonating unit may further include a first insertion layer in contact with the intermediate metal layer.

The resonating unit may further include a second insertion layer disposed further outwardly from the intermediate metal layer than the first insertion layer.

At least one of the first and second insertion layers may include a metal insertion layer.

The acoustic resonator may further include a first metal layer in which at least a portion thereof is disposed on an upper side of the first electrode and electrically connected to the first electrode; and a second metal layer in which at least a portion thereof is disposed on an upper side of the second electrode and electrically connected to the second electrode.

The intermediate metal layer may include the same material as the material of at least a portion of the first and second metal layers.

The intermediate metal layer may include a material different from that of the first and second electrodes In another general aspect, an acoustic resonator includes: a resonating unit including a piezoelectric layer, and first and second electrodes disposed on a lower side and an upper side of the piezoelectric layer, respectively; a substrate disposed on a lower side of the resonating unit; a support unit providing a cavity between the substrate and the resonating unit; a pillar disposed on a lower side of the intermediate metal layer in the cavity and connecting between the resonating unit and the substrate; and an intermediate metal layer electrically connected to the second electrode and positioned on an upper side of the pillar.

The intermediate metal layer may be disposed on an upper surface of the second electrode.

The acoustic resonator may further include a metal insertion layer in which at least a portion thereof is disposed between the intermediate metal layer and the pillar.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
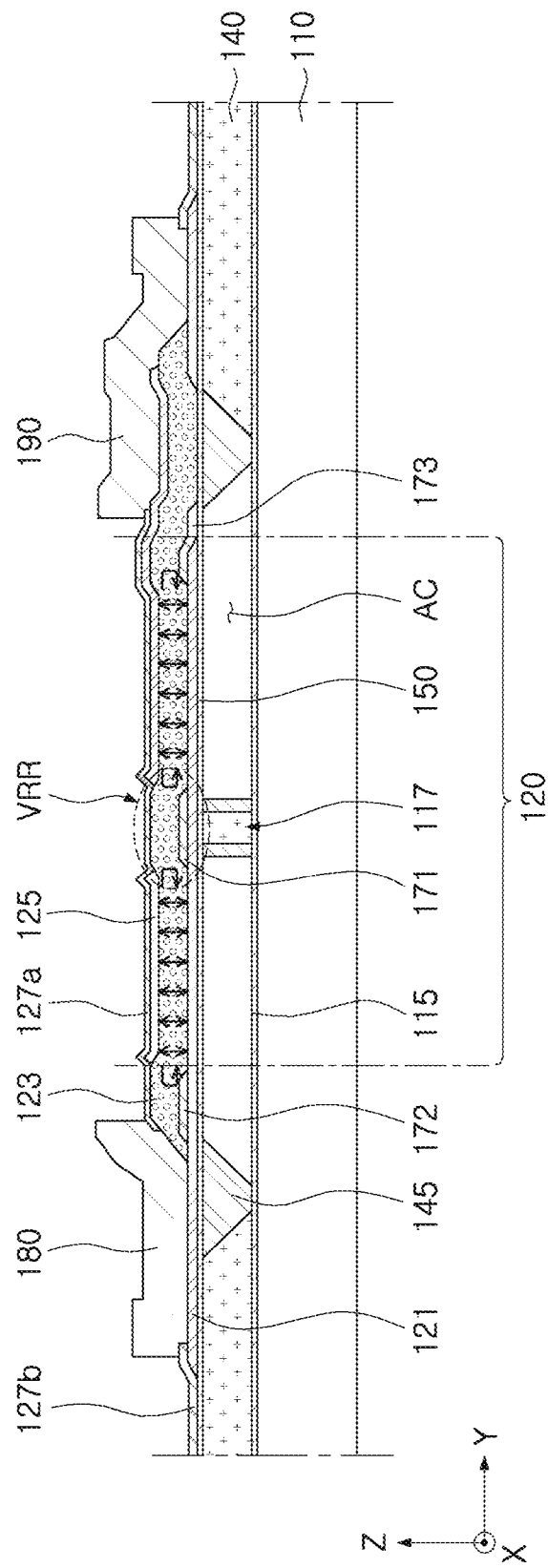
FIGS. 1A to 1D are side views illustrating an acoustic resonator and an insertion layer included therein, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIGS. 1A to 1D are side views illustrating an acoustic resonator and an insertion layer included therein, according to embodiments.

Referring to FIGS. 1A to 1D, an acoustic resonator, according to an embodiment, may include a resonating unit 120 in which a first electrode 121, a piezoelectric layer 123, and a second electrode 125 are sequentially stacked.

The first and second electrodes 121 and 125 may induce an electric field in the piezoelectric layer 123 when receiving electrical energy. For example, the first and second electrodes 121 and 125 may be formed of gold, molybdenum, ruthenium, iridium, aluminum, platinum, titanium, tungsten, palladium, tantalum, chromium, nickel or a metal containing any one or any combination of any two or more thereof, and may include either one of a rare earth metal and a transition metal. However, the first and second electrodes 121 and 125 are not limited to the foregoing materials.

The electric field induced in the piezoelectric layer 123 by the first and second electrodes 121 and 125 may induce a piezoelectric phenomenon in the piezoelectric layer 123 to cause vibrations in a predetermined direction of the resonating unit 120. Accordingly, the resonating unit 120 may generate resonance while generating bulk acoustic waves in a direction corresponding to a vibration direction (for example, a vertical direction).

For example, zinc oxide (ZnO), aluminum nitride (AlN), doped aluminum nitride, lead zirconate titanate, quartz, and the like, may be selectively used as a material of the piezoelectric layer 123. The doped aluminum nitride may further include a rare earth metal, a transition metal, or an alkaline earth metal. As an example, the rare earth metal may include any one or any combination of any two or more of scandium (Sc), erbium (Er), yttrium (Y), and lanthanum (La), and the rare earth metal content may be 1 to 20 at %. The transition metal may include any one or any combination of any two or more of hafnium (Hf), titanium (Ti), zirconium (Zr), tantalum (Ta), and niobium (Nb). In addition, the alkaline earth metal may include magnesium (Mg).

By the resonance, the resonating unit 120 may pass or cut off a signal in a specific frequency band applied to the first and/or second electrodes 121 and 125 and may cut off or pass energy other than in the specific frequency band. An acoustic resonator may have a sharp skirt characteristic at a boundary of the specific frequency band, and thus may be used for a high frequency circuit (for example, a filter, an oscillator, or the like) in a microwave frequency band (for example, several hundreds of MHz to several tens of GHz), such that the performance of the high frequency circuit may be improved or the size of the high frequency circuit may be reduced.

In addition, the acoustic resonator may include a cavity AC disposed on a lower side of the resonating unit 120 to prevent acoustic waves from leaking to the substrate 110. That is, the cavity AC may separate the substrate 110 and the resonating unit 120 from each other, thereby preventing the acoustic waves from leaking to the substrate 110.

Accordingly, the acoustic resonator may have a further improved quality factor QF. For example, the cavity AC may include at least one reflective layer to more effectively prevent substrate leakage of the acoustic waves.

In addition, because the cavity AC is provided inside a support unit 140, the resonating unit 120, which is supported by the support unit 140, may be formed to be generally flat. An etch stop layer 145 may be disposed along a boundary of the cavity AC such that the side of the cavity AC is determined in the process of forming the cavity AC.

The resonating unit 120 may generate heat due to the applied electric field and vibration. Almost all of the generated heat may be radiated in a horizontal direction due to the cavity AC. The heat radiated in the horizontal direction may radiate to the substrate 110 through the support unit 140 and/or the etch stop layer 145. That is, the heat generated in the resonating unit 120 may be diverted and radiated.

The acoustic resonator may provide an additional radiation path of the heat generated in the resonating unit 120 by including a pillar 117.

Accordingly, the acoustic resonator may improve heat generation efficiency while having an improved quality factor based on the cavity AC, and thus may have improved robustness in comparison to conventional acoustic resonators.

However, the pillar 117 may form a path through which vibrations of the resonating unit 120 leak to the substrate 110. The vibration leakage of the resonating unit 120 may cause deterioration of the quality factor.

A portion of the resonating unit 120 which overlaps with the pillar 117 vertically may include a hole VRR in the first and second electrodes 121 and 125, but the hole VRR may be omitted according to design parameters.

The resonating unit 120 may further include a first insertion layer 171 disposed on the portion of the resonating unit 120 vertically overlapping with the pillar 117.

The first insertion layer 171 may reflect vibration toward the pillar 117 in the piezoelectric layer 123. Accordingly, leaking of the vibration of the resonating unit 120 through the pillar 117 may be reduced.

For example, the first insertion layer 171 may be formed of a dielectric such as silicon oxide ($SiO_2$), aluminum nitride (AlN), aluminum oxide ($Al_2O_3$), silicon nitride (SiN), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO), or the like, but may be formed of a material different from the piezoelectric layer 123. In addition, the first insertion layer 171 may be formed of a conductive material such as aluminum (Al), titanium (Ti), or the like, but may be formed of a material different from that of the first and second electrodes 121 and 125. In addition, if necessary, it is also possible to form a region in which the first insertion layer 171 is replaced by an air space. This configuration may be realized by forming all of the resonating unit 120 in the manufacturing process, and then removing the first insertion layer 171.

In addition, the thickness of the first insertion layer 171 may be the same as, similar to, or thinner than, that of the piezoelectric layer 123. When the thickness of the first insertion layer 171 is thinner than the thickness of the piezoelectric layer 123, an inclined portion of the piezoelectric layer 123 may be formed due to the first insertion layer 171 and a crack or the like may not occur, thereby contributing to the improvement of the resonator performance. There is no particular lower limit of the thickness of the first insertion layer 171, but the thickness of the first insertion layer 171 may be 100 Å or more to easily adjust the deposition thickness and ensure the uniformity of thickness in a deposited wafer.

For example, a side surface of the first insertion layer 171 may be inclined, and may be formed to have an inclination angle of 5° to 70°, but the disclosure is not limited to such an example.

Referring to FIG. 1A, the first insertion layer 171 may be disposed on an upper surface of the first electrode 121. Accordingly, the piezoelectric layer 123 may have a curvature corresponding to the first insertion layer 171.

Figure 1B:
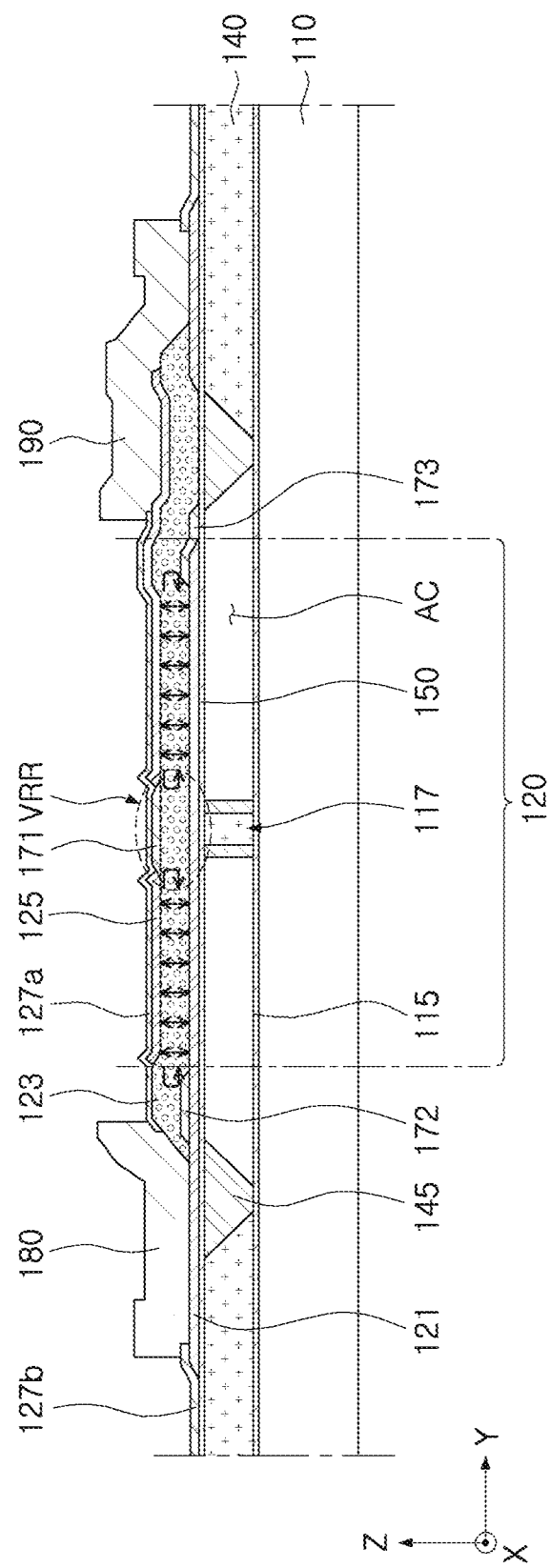

Referring to FIG. 1B, according to another example, the first insertion layer 171 may be disposed on the second electrode 125. Accordingly, the first insertion layer 171 may cover the hole VRR of the second electrode 125.

Figure 1C:
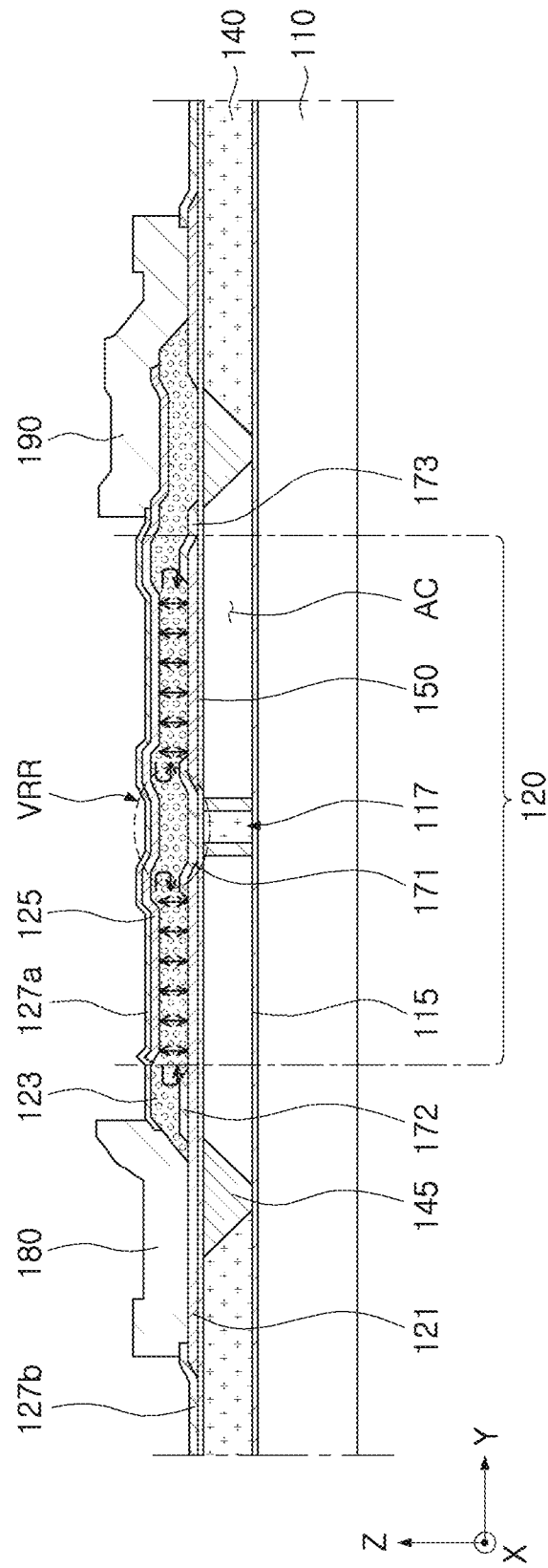

Referring to FIG. 1C, according to another example, the first insertion layer 171 may be disposed to fill a space in which the first electrode 121 is removed. That is, the first insertion layer 171 may cover the hole VRR of the first electrode 121, and the vibration leakage through the pillar 117 in the resonating unit 120 may be further reduced.

Figure 1D:
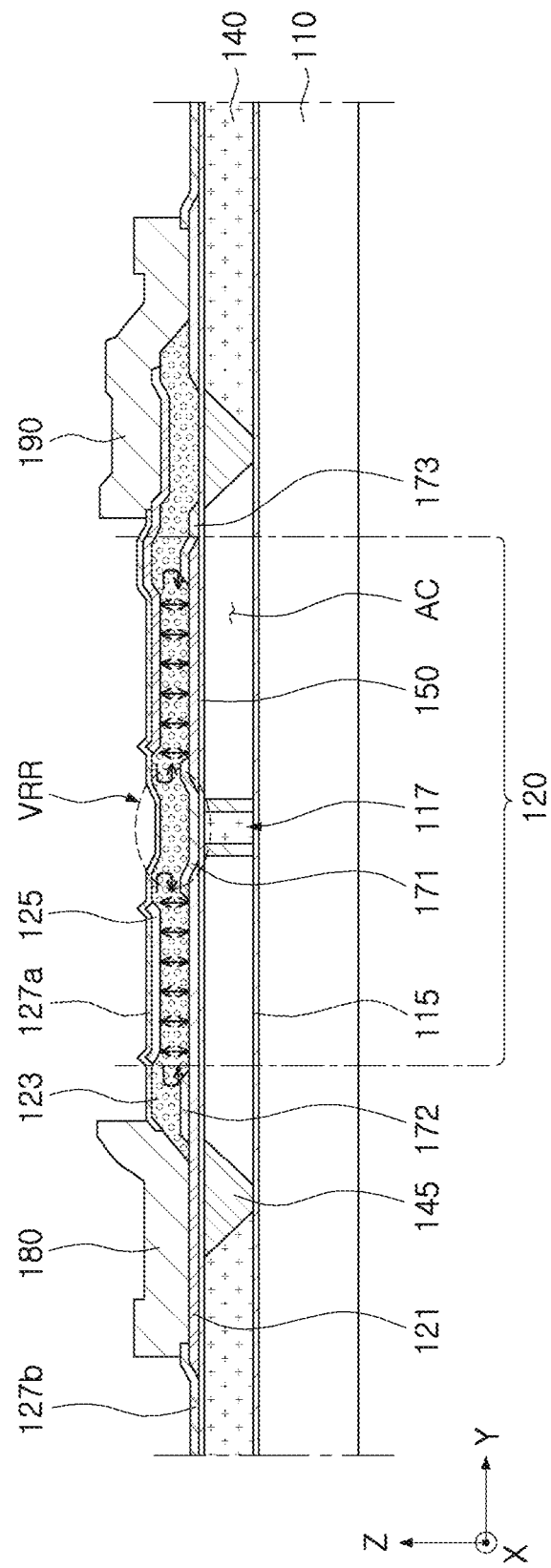

Referring to FIG. 1D, the first insertion layer 171 may be disposed on the hole VRR of the first electrode 121, and the second electrodes 121 and 125 may have the hole VRR.

In addition, referring to FIGS. 1A to 1D, the resonating unit 120 may further include second insertion layers 172 and 173 disposed outwardly from the first insertion layer 171 and the pillar 117 in the horizontal direction (for example: the x direction and/or the y direction). The second insertion layers 172 and 173 may be disposed on the first and/or second electrodes 121 and 125, and may be implemented in the same manner as the first insertion layer 171.

The second insertion layers 172 and 173 may reflect outwardly leaking vibrations among vibrations generated in the resonating unit 120, such that the quality factor of the resonating unit 120 may be further improved.

Figure 2A:
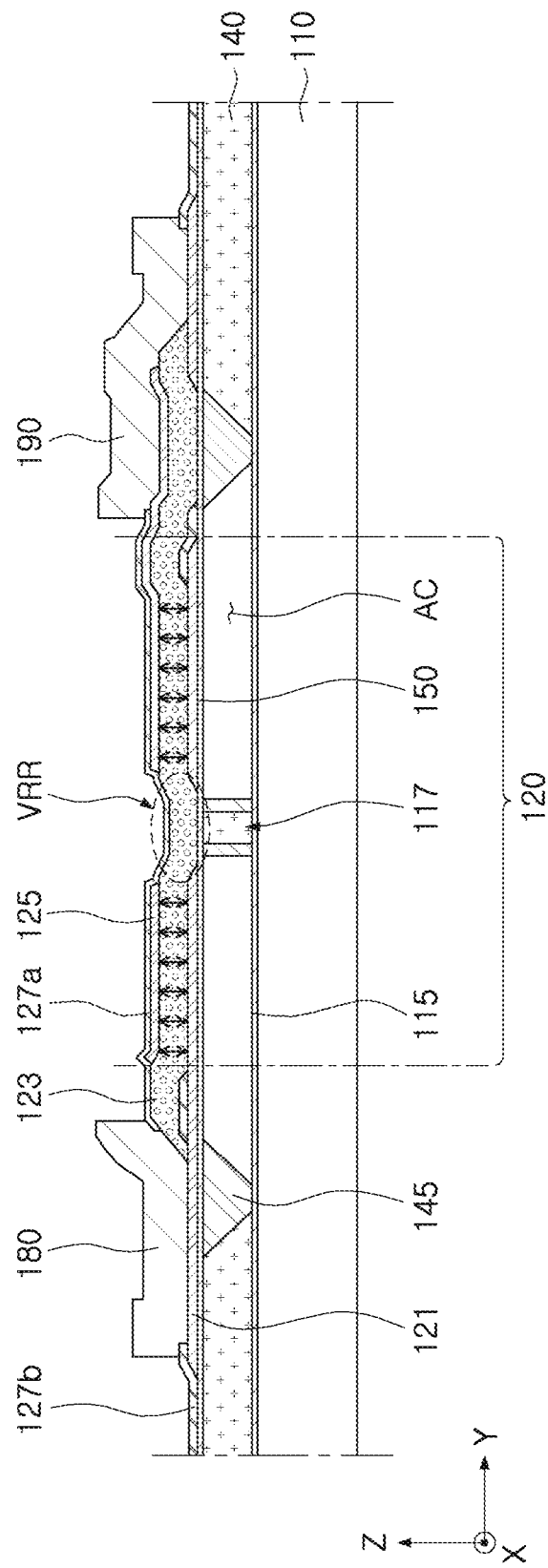
FIGS. 2A to 2C are side views illustrating an acoustic resonator, according to an embodiment, having a structure in which an insertion layer corresponding to a hole is omitted, in comparison to the acoustic resonator illustrated in FIGS. 1A to 1D.
Figure 2B:
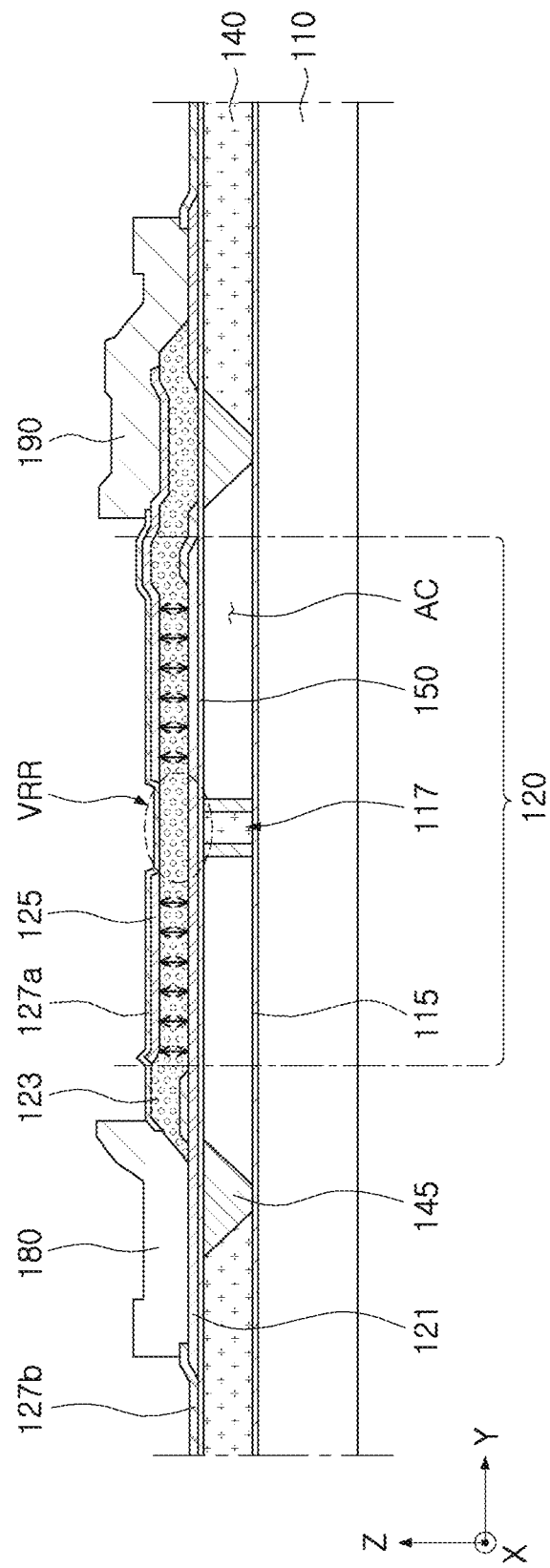
Figure 2C:
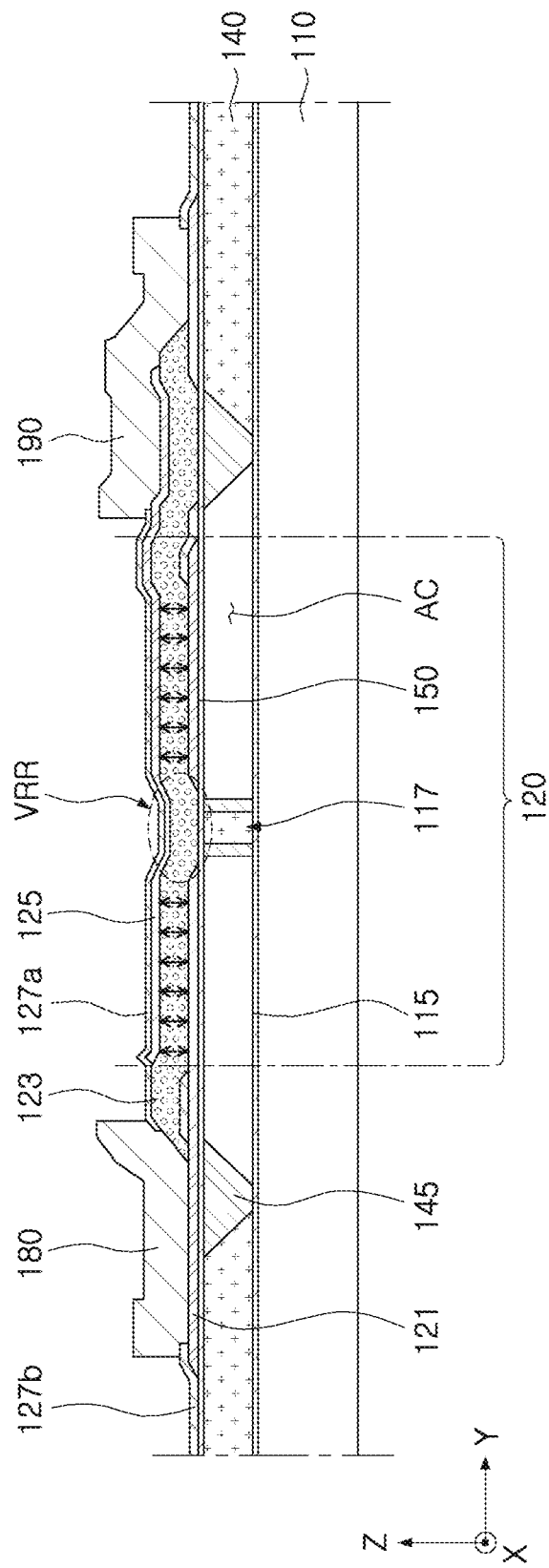

FIGS. 2A to 2C are side views illustrating an acoustic resonator, according to an embodiment, having a structure in which the insertion layer 171 corresponding to the hole VRR is omitted, in comparison to the acoustic resonator of FIGS. 1A to 1D.

Referring to FIGS. 2A to 2C, either one or both of the first and second electrodes 121 and 125 of the acoustic resonator 200 may reduce vibrations generated on the upper side of the pillar 117 by including the hole VRR.

Accordingly, the vibration of the resonating unit 120 may be more concentrated on a portion not overlapping the pillar 117 than a portion overlapping the pillar 117.

Therefore, the acoustic resonator 200 may reduce vibration leakage to the substrate 110 while ensuring an improved quality factor and heat generation efficiency due to the inclusion of the cavity AC and the pillar 117.

FIGS. 3A to 3D are side views illustrating various structures of a pillar of an acoustic resonator, according to an embodiment.

Figure 3A:
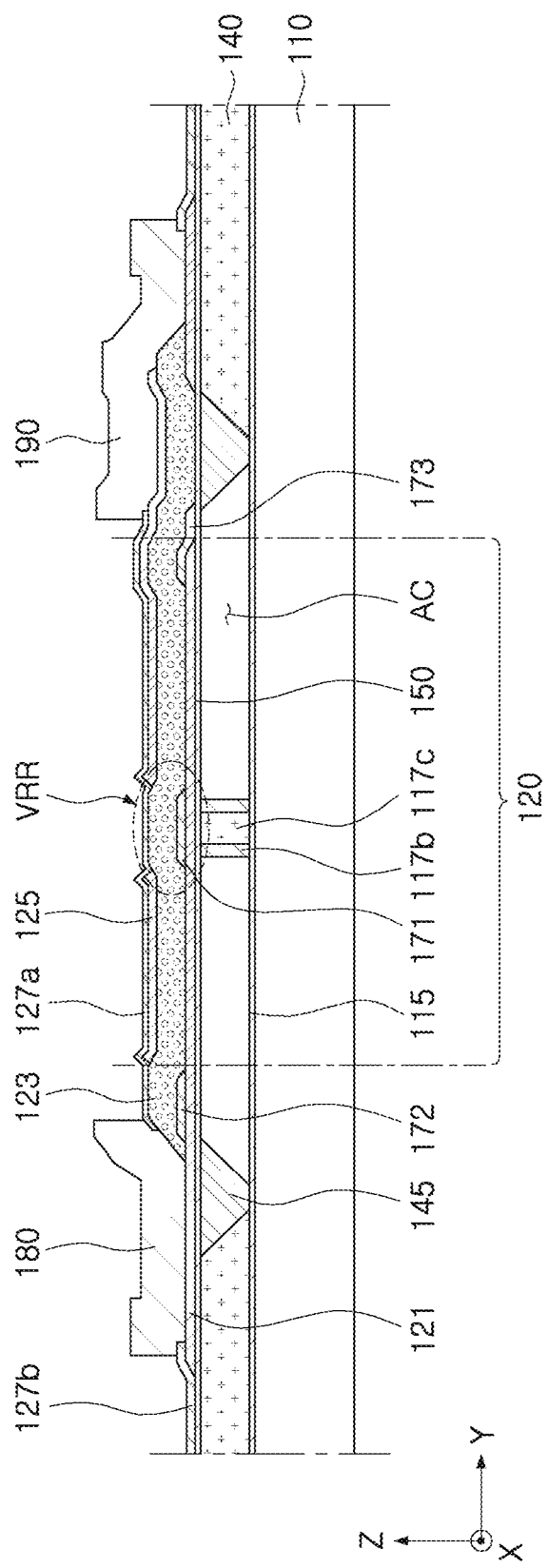
FIGS. 3A to 3D are side views illustrating various structures of pillars of an acoustic resonator, according to an embodiment.

Referring to FIG. 3A, the pillar may be disposed in the cavity AC, and may include a second etch stop layer 117b disposed between the resonating unit 120 and the substrate 110, and a thermally conductive layer 117c surrounded by the second etch stop layer 117b.

The second etch stop layer 117b may protect the thermally conductive layer 117c in the process of forming the cavity AC. The second etch stop layer 117b may be formed of the same material as the first etch stop layer 145, but is not limited to being formed of the same material as the first etch stop layer 145.

The thermally conductive layer 117c may be formed of the same material as the support unit 140, but is not limited to the same material as the support unit 140. For example, the thermally conductive layer 117c may be formed of a material having thermal conductivity higher than that of the second etch stop layer 117b, thereby transferring the heat generated in the resonating unit 120 to the substrate 110 more efficiently.

For example, when the support unit 140 is formed of Poly-Si, the second etch stop layer 117b may be made of a material having high thermal conductivity, such as an AlN series material and a rare earth doped AlN series material.

Figure 3B:
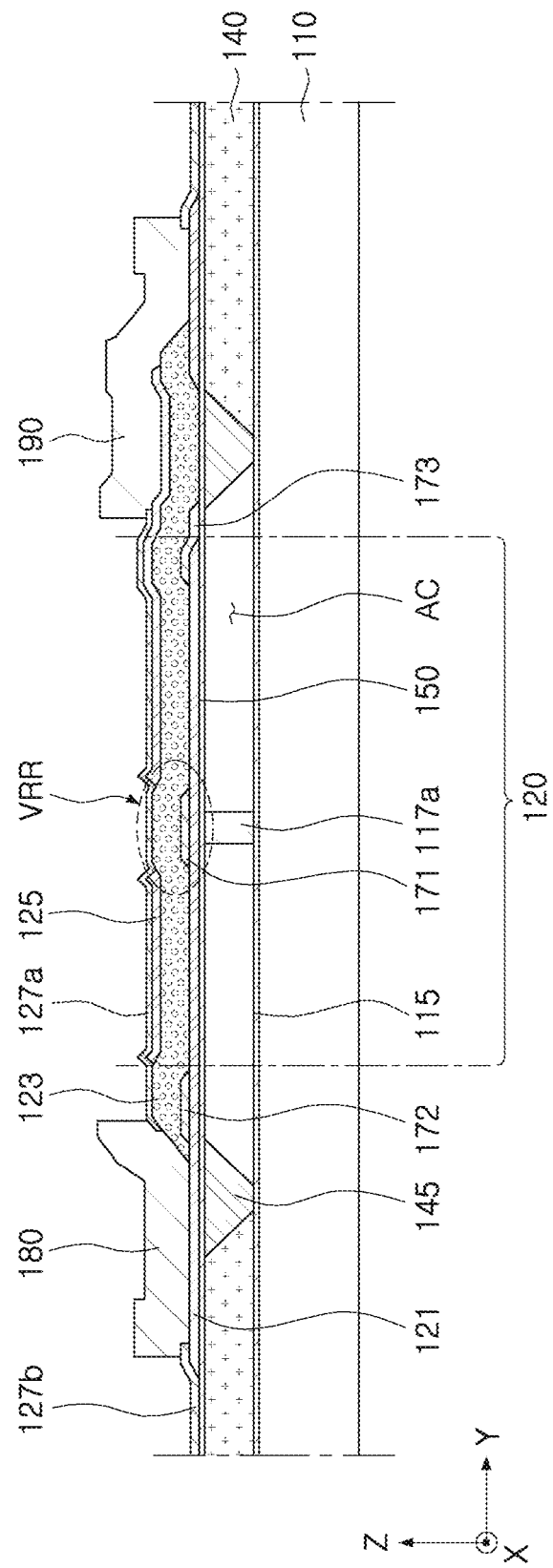

Referring to FIG. 3B, the pillar may only be formed of a metal pillar 117a without the second etch stop layer 117b. Accordingly, heat generated in the resonating unit 120 may be transmitted more efficiently to the substrate 110. For example, the metal pillar 117a may be made of Au or Cu.

Figure 3C:
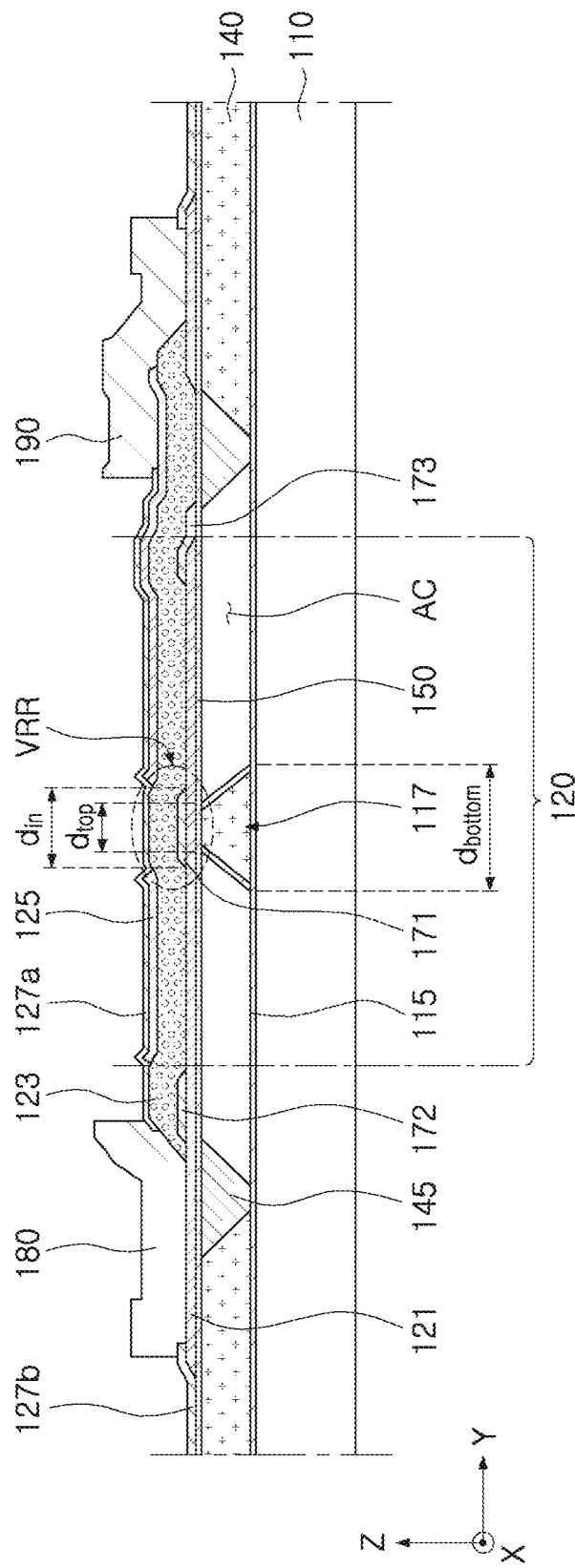
Figure 3D:
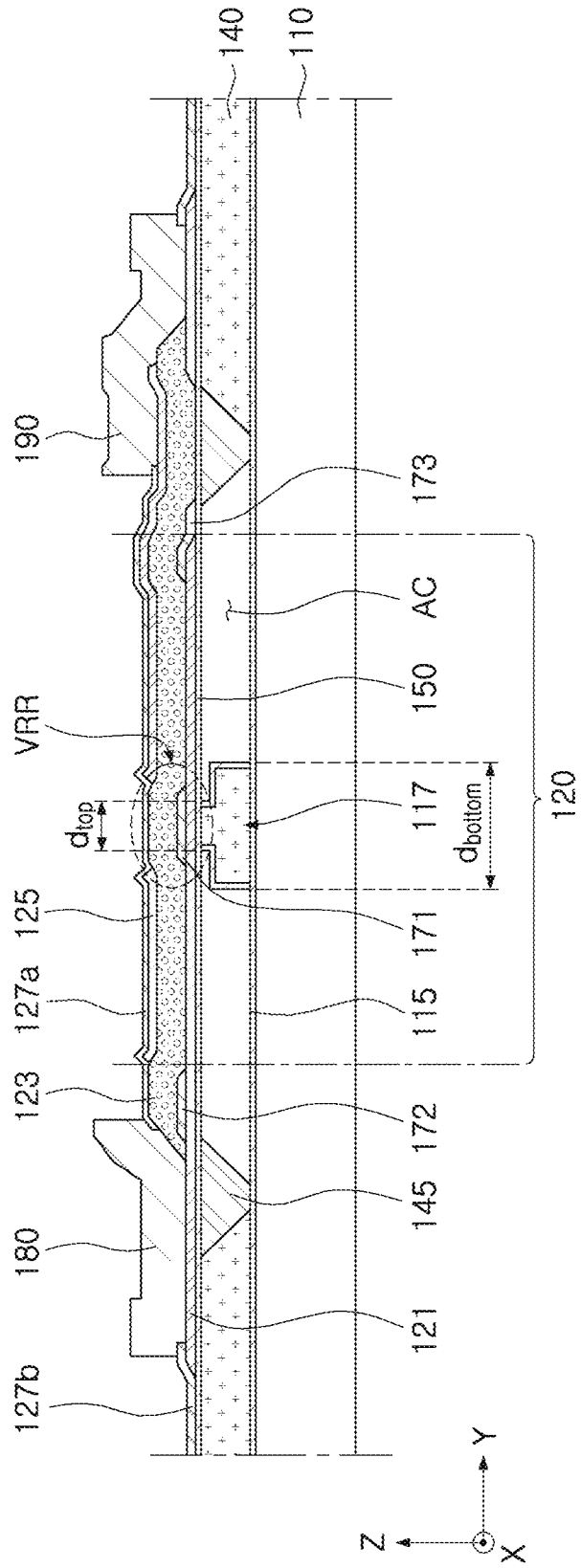

Referring to FIGS. 3C and 3D, a width $d_{bottom}$ of a lower surface of the pillar 117 may be greater than a width $d_{top}$ of an upper surface of the pillar 117.

The vibrations leaking from the resonating unit 120 to the pillar 117 may be further reduced as the width $d_{top}$ of the upper surface of the pillar 117 is narrowed. Thermal resistance of the pillar 117 may be lowered as the width $d_{bottom}$ of the lower surface of the pillar 117 is widened.

Therefore, the acoustic resonator, according to an embodiment, may further improve heat radiation performance while reducing the vibration leakage to the substrate 110.

For example, the width $d_{top}$ of the upper surface of the pillar 117 may be less than a width of the first insertion layer 171, and the width $d_{bottom}$ of the lower upper surface of the pillar 117 may be greater than the width of the first insertion layer 171.

FIGS. 4A to 4E are side views illustrating various structures of an insertion layer of an acoustic resonator, according to an embodiment.

Referring to FIGS. 4A to 4D, a first insertion layer may include a first metal insertion layer 176.

The first metal insertion layer 176 may reflect the vibration toward the pillar 117 from the resonating unit 120 while utilizing the high thermal conductivity of the resonating unit 120 to efficiently transmit heat generated in the resonating unit 120 to the pillar 117.

In addition, a second insertion layer may include second metal insertion layers 177 and 178 electrically connected to the first electrode 121 and the second electrode 125, respectively. The second metal insertion layers 177 and 178 may not only reflect outwardly leaking vibrations among vibrations generated in the resonating unit 120 but also reduce connection resistance with respect to the first and second metal layers 180 and 190 and the first and second electrodes 121 or 125, such that insertion loss of the acoustic resonator may be improved.

Figure 4A:
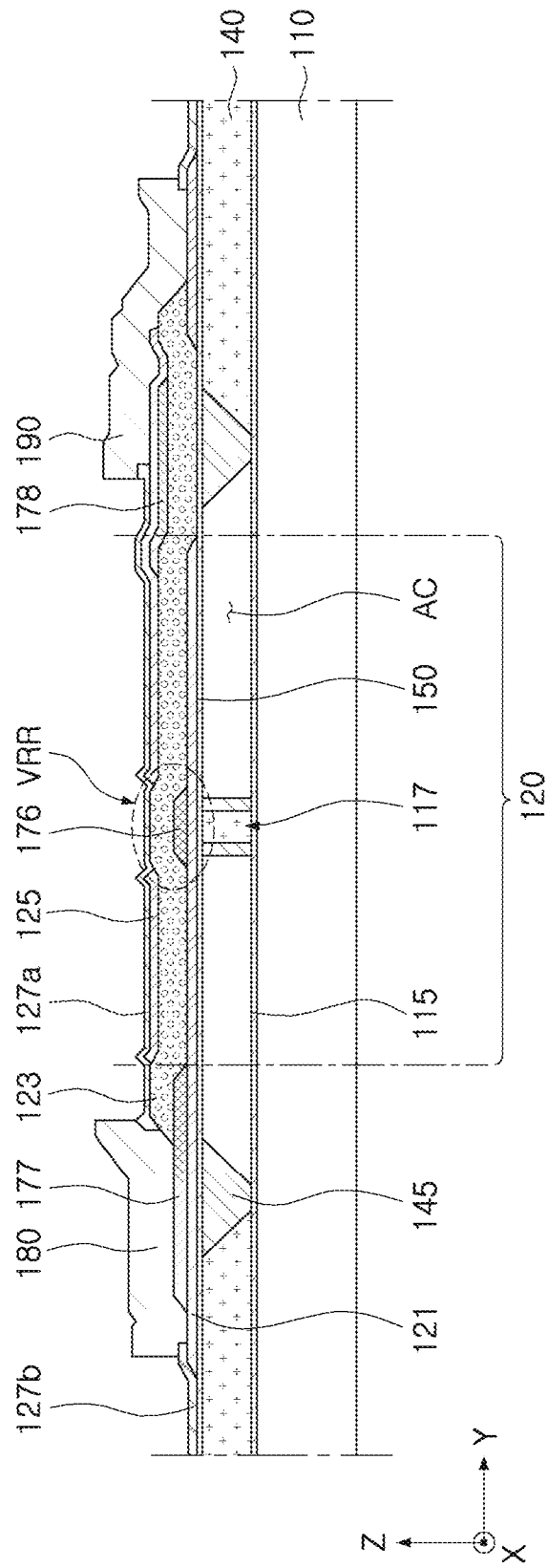
FIGS. 4A to 4E are side views illustrating various structures of insertion layers of an acoustic resonator, according to an embodiment.
Figure 4B:
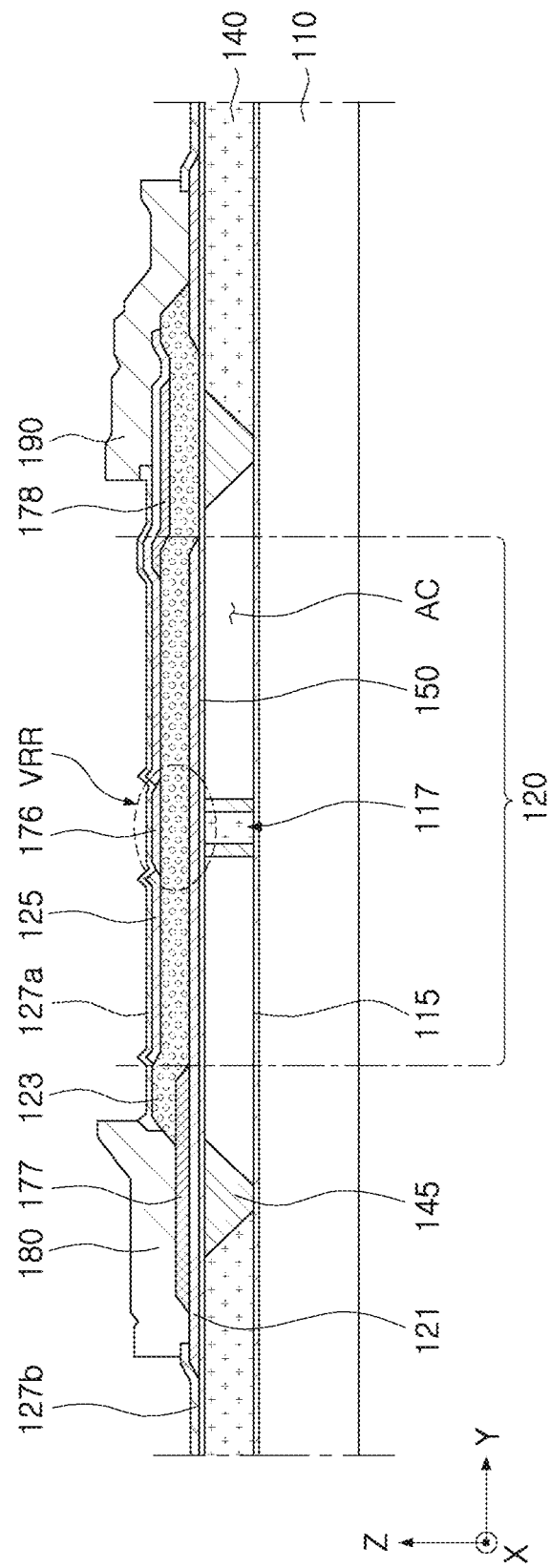
Figure 4C:
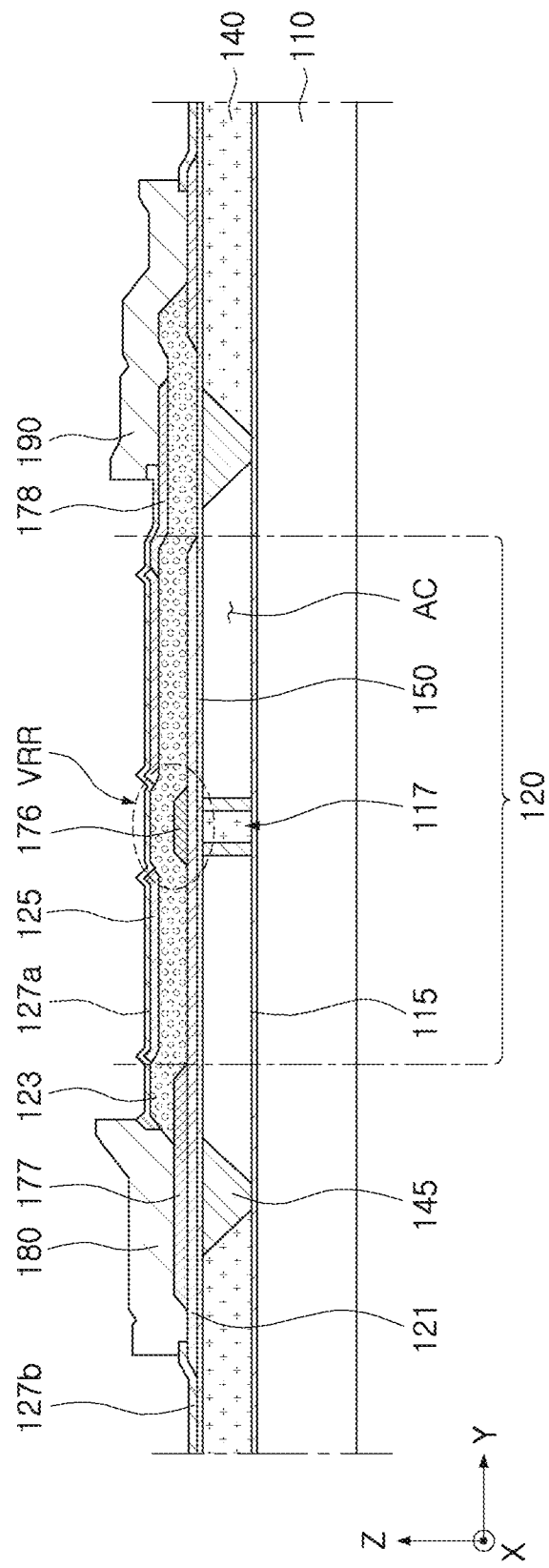
Figure 4D:
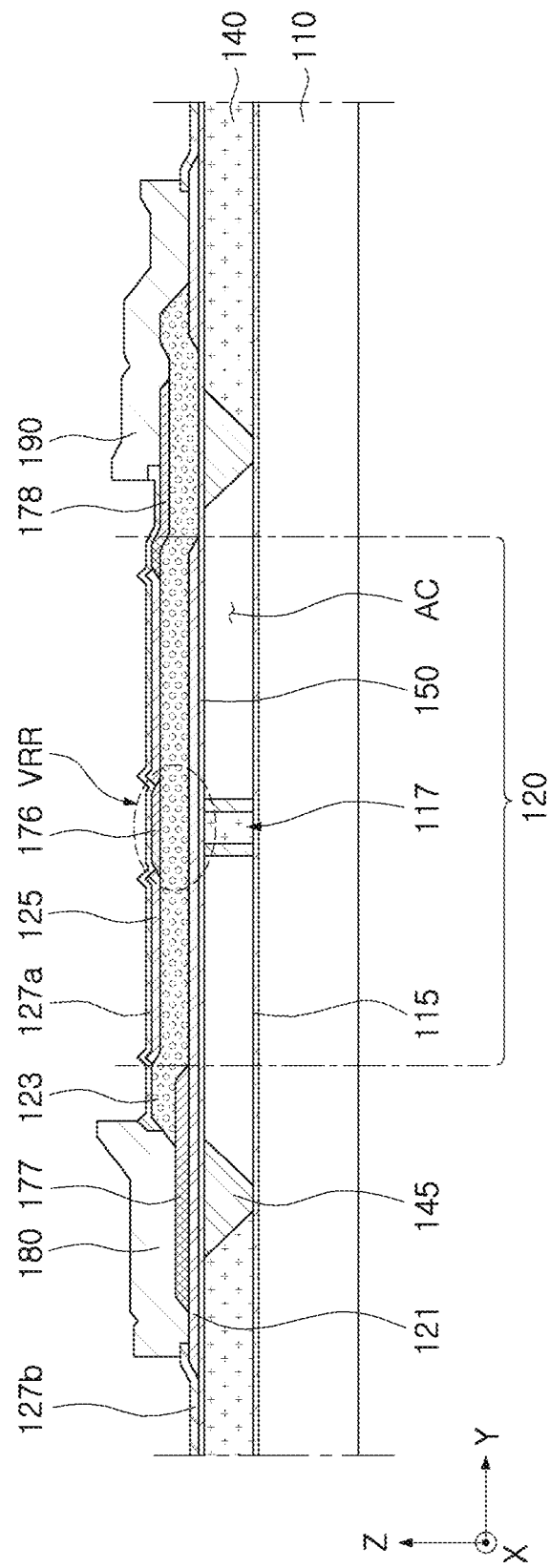
Figure 4E:
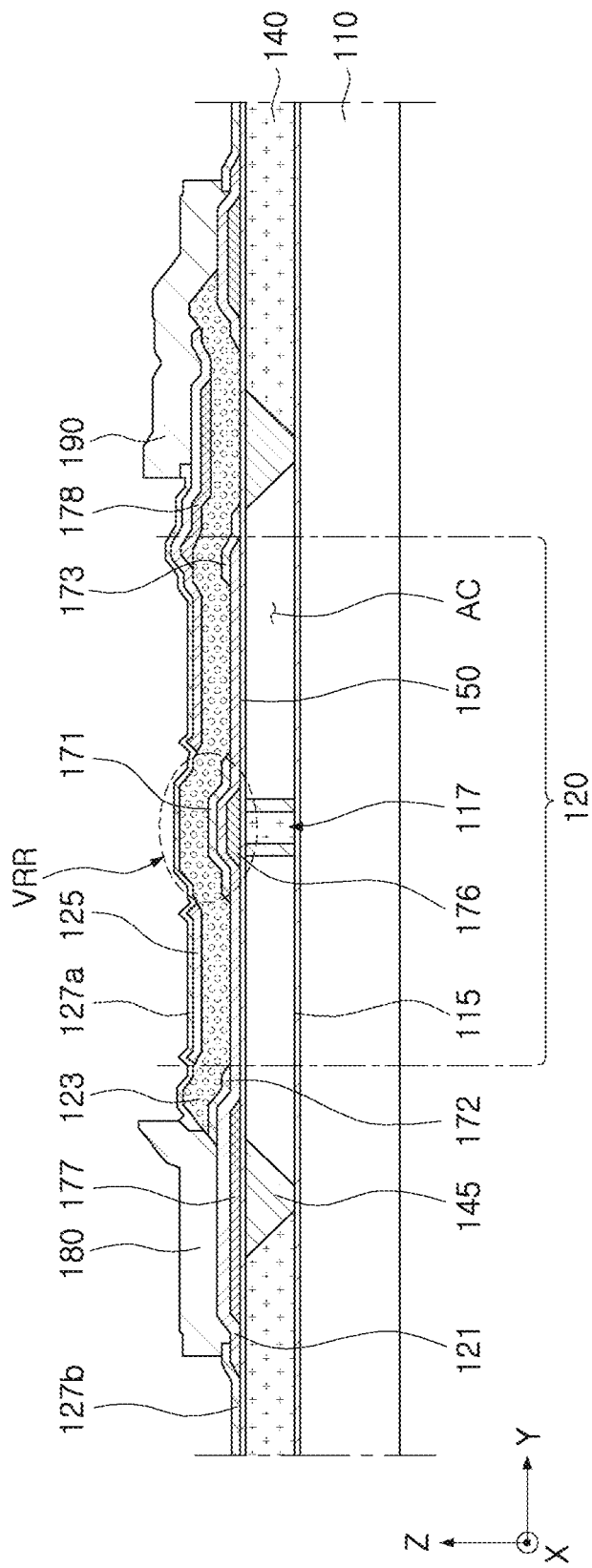

Referring to FIG. 4E, the first insertion layer 171 may be formed of an insulating material disposed between the first electrode 121 and the piezoelectric layer 123, and the first metal insertion layer 176 may be disposed between the first electrode 121 and the pillar 117.

The first insertion layer 171 may have a relatively low acoustic impedance compared to the first metal insertion layer 176, such that the vibrations of the resonating unit 120 may be effectively reflected more efficiently.

The first metal insertion layer 176 may have much higher thermal conductivity than that of the first insertion layer 171, such that the heat radiation efficiency of the pillar 117 may be improved.

A combined structure of the first insertion layer 171 made of an insulating material and the first metal insertion layer 176 may have high acoustic wave reflection characteristics while having high heat radiation efficiency.

FIGS. 5A to 5E are side views illustrating various structures of a frame included in an acoustic resonator, according to an embodiment.

Figure 5A:
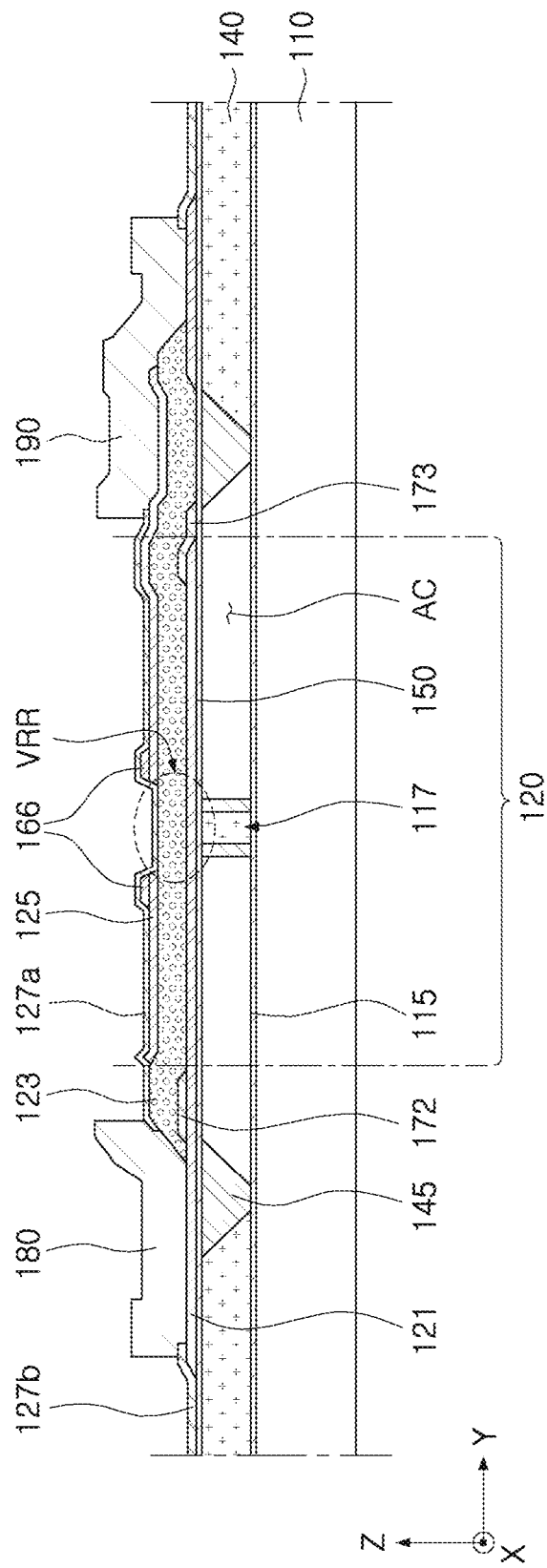
FIGS. 5A to 5E are side views illustrating various structures of frames included in an acoustic resonator, according to an embodiment.
Figure 5B:
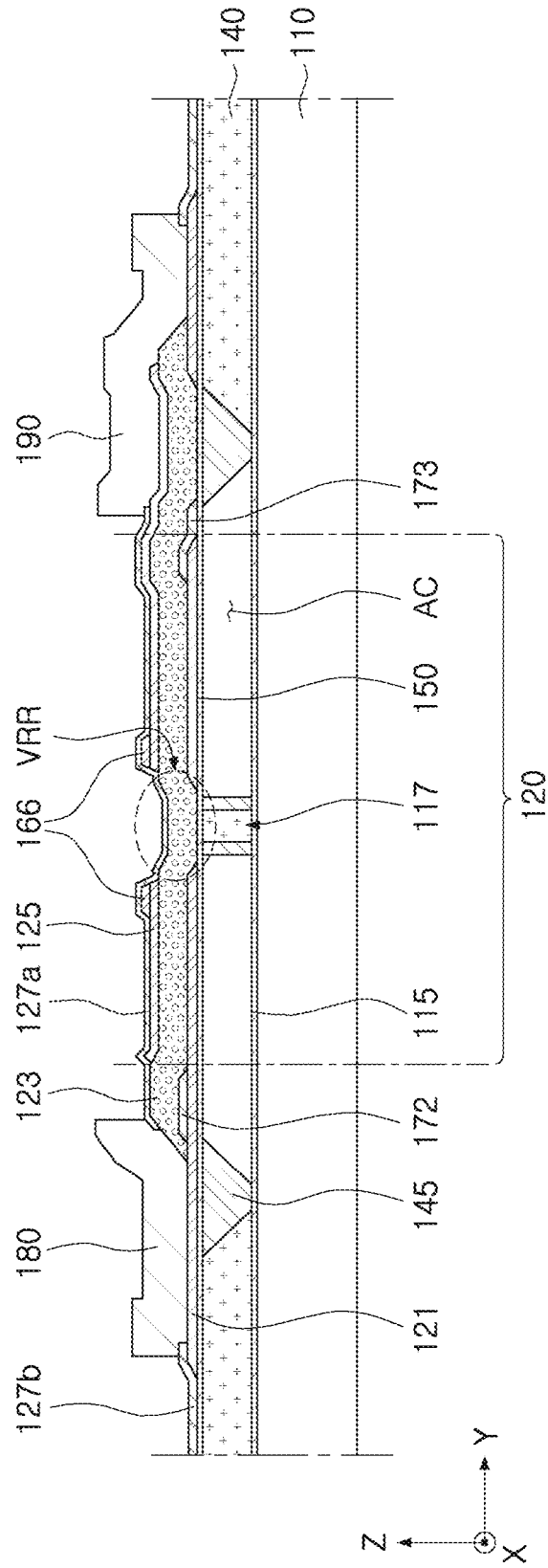

Referring to FIGS. 5A and 5B, the acoustic resonator may further include a first frame 166 disposed on an upper side of the second electrode 125 and disposed to surround the hole VRR.

The first frame 166 may act complementarily on the second insertion layers 172 and 173. The resonating unit 120 may have a bent shape on the upper side of the second insertion layers 172 and 173 according to the disposition of the second insertion layers 172 and 173. The first frame 166 may adaptively reflect the vibration of the resonating unit 120 to the bent shape of the resonating unit 120.

Accordingly, the acoustic resonator may further suppress the leakage of the vibration through the pillar 117.

Figure 5C:
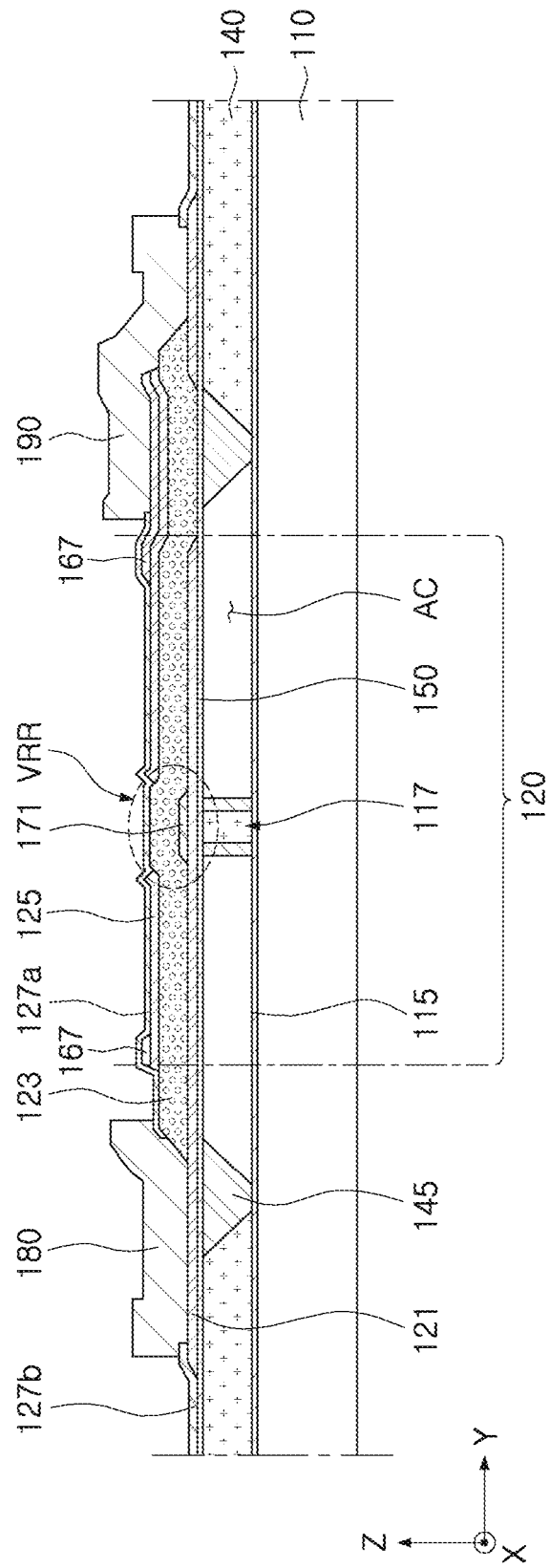
Figure 5D:
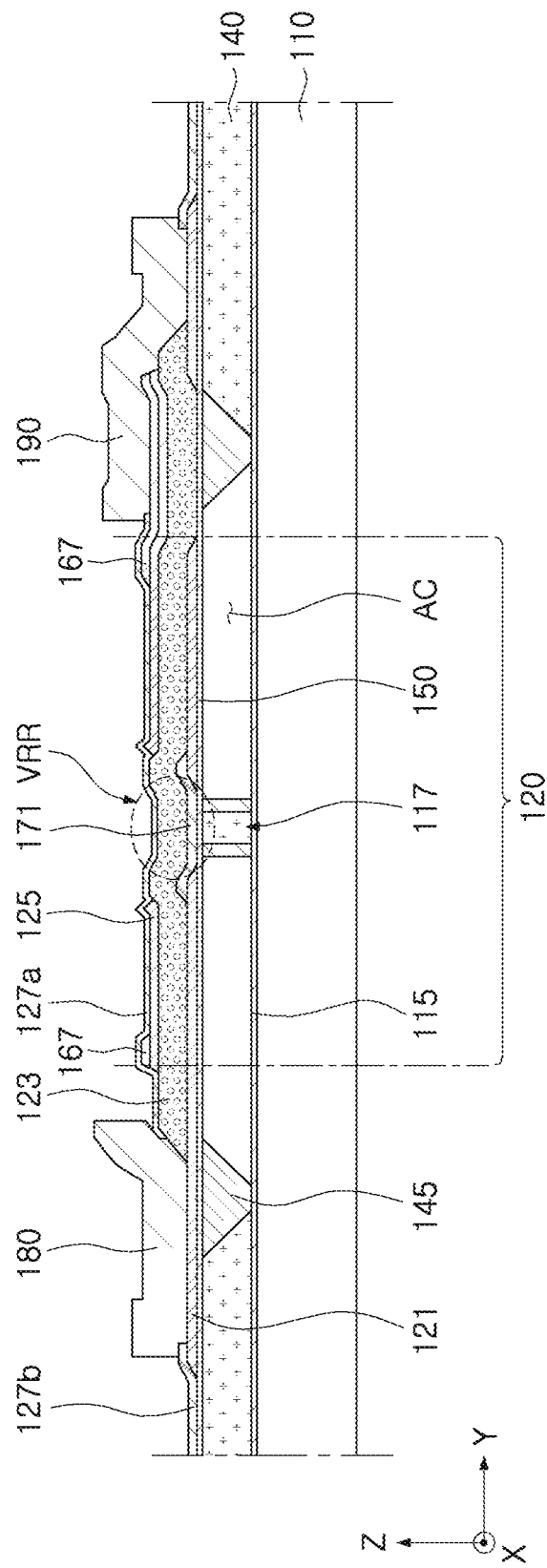

Referring to FIGS. 5C and 5D, the acoustic resonator may further include a second frame 167 disposed to surround the resonating unit 120 while surrounding the hole VRR. The second frame 167 may be disposed on an upper side of the second electrode 125.

The second frame 167 may complementarily act on the first insertion layer 171.

Figure 5E:
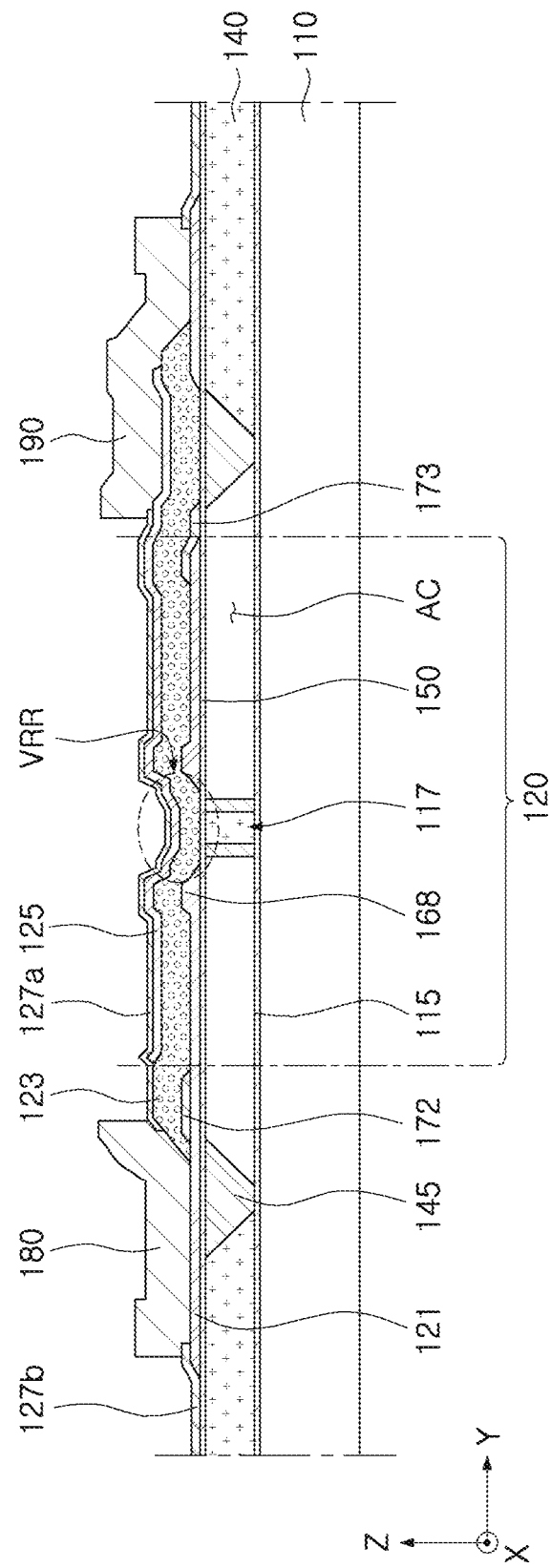

Referring to FIG. 5E, the acoustic resonator may further include a third frame 168 disposed on the upper side of the first electrode 121. The third frame 168 may be disposed lower than the above-described first and second frames 166 and 167, and may reflect the vibrations of the resonating unit 120 according to a principle similar to that of the first and second frames 166 and 167. The third frame 168 may be made of the same material as the first electrode 121, but is not limited to being made of the same material as the first electrode 121.

For example, the third frame 168 may be disposed to surround the hole VRR like the first frame 166, and may be disposed to surround the resonating unit 120 like the second frame 167, such that the size of a region surrounded by the third frame 168 is not particularly limited.

Referring to FIGS. 1A to 5D, the acoustic resonator may further include a substrate 110, an insulating layer 115, protective layers 127a and 127b, a membrane layer 150, and first and second metal layers 180 and 190.

The substrate 110 may be a silicon substrate. For example, a silicon wafer may be used as the substrate 110. Alternatively, a silicon on insulator (SOI) type substrate may be used as the substrate 110.

The insulating layer 115 may be formed on an upper surface of the substrate 110, and the substrate 110 may be electrically isolated from the resonating unit 120. In addition, the insulating layer 115 may prevent the substrate 110 from being etched by an etching gas when the cavity AC is formed during a manufacturing process of the acoustic resonator.

In this case, the insulating layer 115 may be formed of any one or any combination of any two or more of silicon dioxide ($SiO_2$), silicon nitride ($Si_3N_4$), aluminum oxide ($Al_2O_3$) and aluminum nitride (AlN), and may be formed on the substrate 110 through any one or any combination of any two or more of thermal oxidation, chemical vapor deposition, RF magnetron sputtering, and evaporation.

The membrane layer 150 may be formed on the support unit 140 to define the thickness (or height) of the cavity AC together with the substrate 110. However, the disclosure is not limited to such a configuration, and the acoustic resonator may have a structure without the membrane layer 150.

The membrane layer 150 may be formed of a material which is not easily removed in the process of forming the cavity AC. For example, when a halide-based etching gas such as fluorine (F), chlorine (Cl), or the like is used to remove a portion of the support unit (for example, a cavity region), the membrane layer 150 may be formed of a material having low reactivity with the etching gas. In this case, the membrane layer 150 may include either one or both of silicon dioxide ($SiO_2$) and silicon nitride ($Si_3N_4$).

In addition, the membrane layer 150 may be formed of a dielectric layer containing any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), and may be formed of a metal layer containing any one or any combination of any two or more of aluminum (Al), nickel (Ni), chrome (Cr), platinum (Pt), gallium (Ga), and hafnium (Hf). However, the disclosure is not limited to the foregoing examples.

A seed layer made of aluminum nitride (AlN) may be formed on the membrane layer 150. Specifically, the seed layer may be disposed between the membrane layer 150 and the first electrode 121. In addition to AlN, the seed layer may further include a rare earth metal, a transition metal, or an alkaline earth metal in the case of a doped aluminum nitride, and may be formed using a dielectric material or metal having an HCP structure. In addition to AlN, the seed layer may further include a rare earth metal, a transition metal, or an alkaline earth metal in the case of a doped aluminum nitride, and may be formed using a dielectric material or metal having an HCP structure. For example, in the case of the seed layer being formed of a metal, the seed layer may be formed of titanium (Ti).

Protective layers 127a and 127b may be disposed along the surface of the acoustic resonator (for example, the upper surface of the second electrode or the upper surface of the piezoelectric layer) to protect the acoustic resonator from the outside. Further, portions of the protective layers 127a and 127b may be removed by etching for frequency adjustment in a final process. That is, thicknesses of the protective layers 127a and 127b may be freely adjusted according to design parameters.

The protective layer 127 may be formed of any one insulating material of a silicon oxide series material, a silicon nitride series material, an aluminum oxide series material, and an aluminum nitride series material.

First and second metal layers 180 and 190 may be disposed on the upper side of the first and second electrodes 121 and 125, respectively, may be electrically connected to the first and second electrodes 121 and 125, and may act as an external connection terminal to an adjacent acoustic resonator or an input/output port.

The first and second metal layers 180 and 190 may be formed of a material having a resistivity that is lower than that of the first and second electrodes 121 and 125, and the first and second metal layers 180 and 190 may be thicker than the first and second electrodes 121 and 125 to have a low resistance value. Accordingly, the insertion loss of the acoustic resonator may be reduced.

For example, the first and second metal layers 180 and 190 may be formed of gold (Au), a gold-tin (Au—Sn) alloy, copper (Cu), a copper-tin (Cu—Sn) alloy, aluminum (Al), an aluminum-germanium (Al—Ge) alloy, or the like.

FIGS. 6A to 6E are side views illustrating a manufacturing method of an acoustic resonator, according to an embodiment.

Figure 6A:
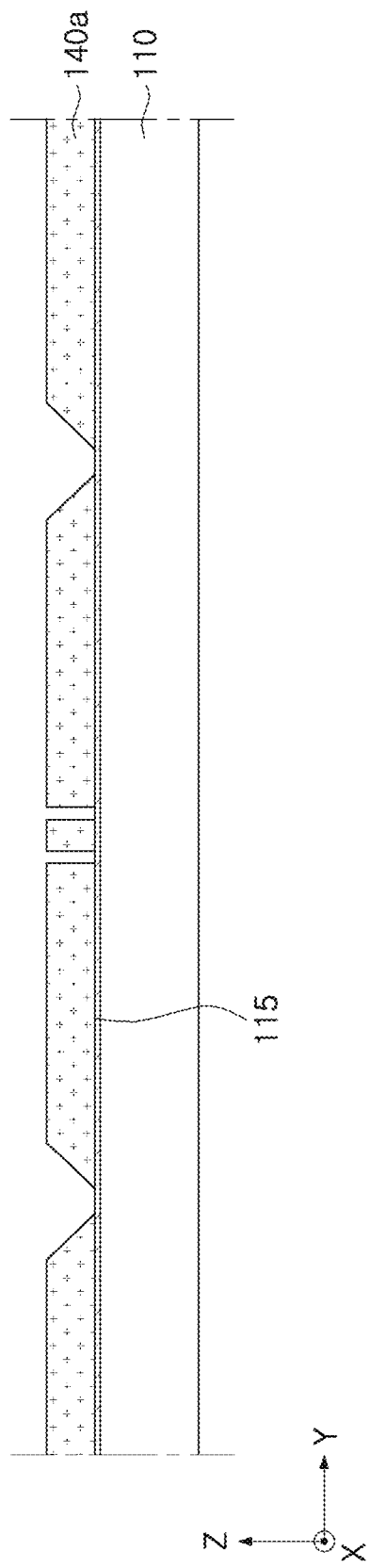
FIGS. 6A to 6E are side views illustrating a manufacturing method of an acoustic resonator, according to an embodiment.

Referring to FIG. 6A, the insulating layer 115 may be formed on the substrate 110, and a support unit 140*a* may be formed on the insulating layer 115. Thereafter, a pattern corresponding to the cavity AC and the pillar 117 may be formed in the support unit 140*a*.

The support unit 140*a* may be formed of a material such as polysilicon, polymer, or the like, which easy to etch, but is not limited to these examples.

Figure 6B:
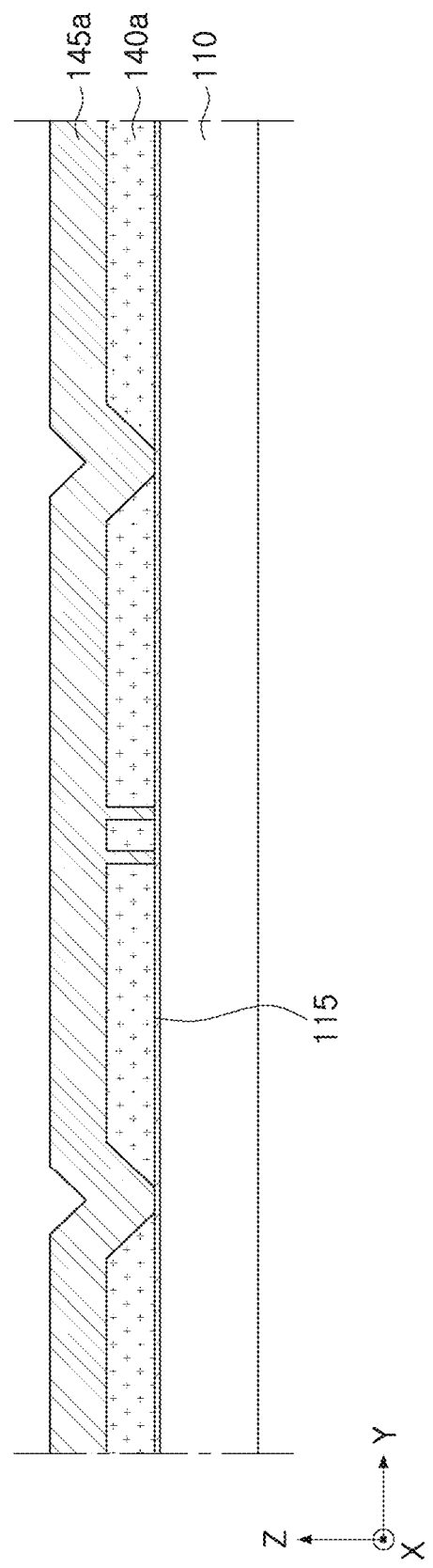

Referring to FIG. 6B, an etch stop layer 145*a* may be deposited on the support unit 140*a*. The etch stop layer 145*a* may be formed of the same material as the insulating layer 115, but is not limited to being formed of the same material as the insulating layer 115.

Figure 6C:
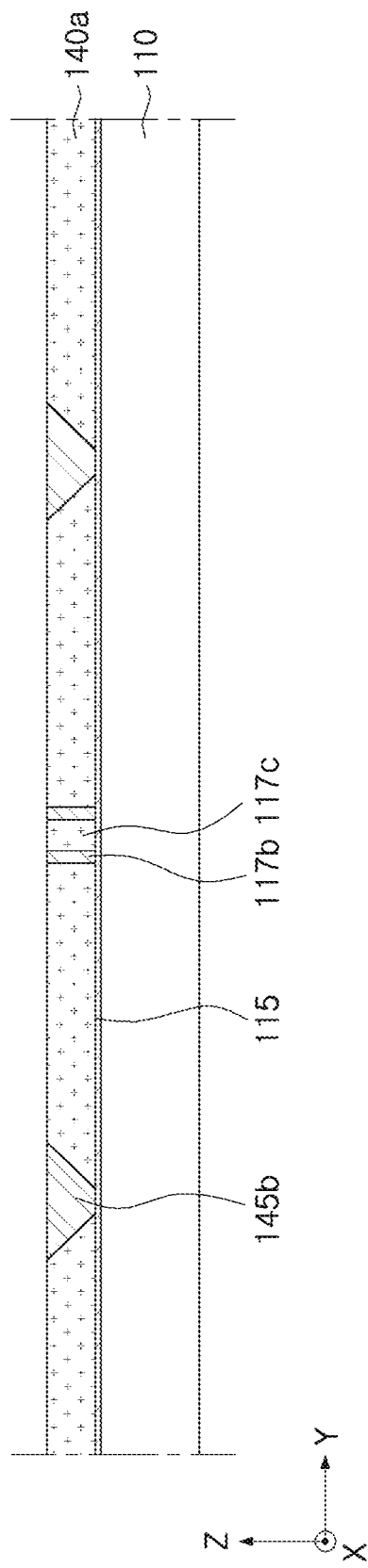

Referring to FIG. 6C, the etch stop layer 145, a second etch stop layer 117*b*, and a thermally conductive layer 117*c* may be formed by planarizing the etch stop layer 145*a*. Accordingly, the pillar 117 is formed by the second etch stop layer 117*b* and the thermally conductive layer 117*c*.

Figure 6D:
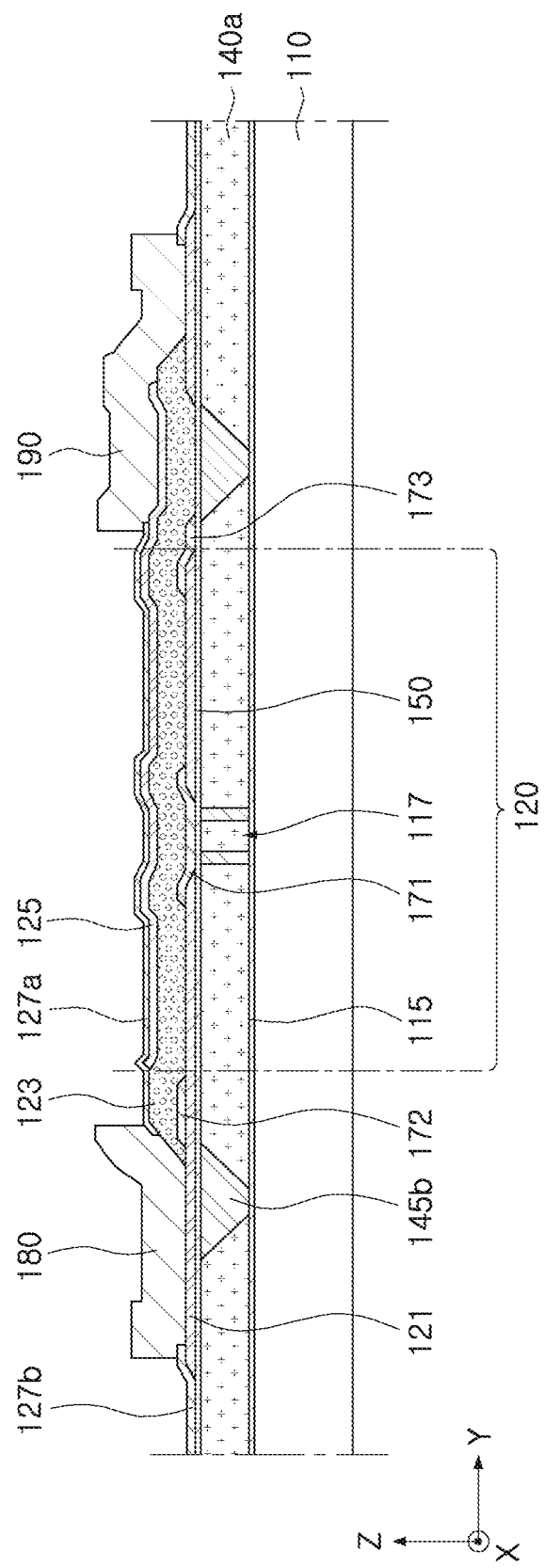

Referring to FIG. 6D, the membrane layer 150, the first electrode 121, the first insertion layer 171 and second insertion layers 172 and 173, the piezoelectric layer 123, the second electrode 125, the protective layer 127, and the first and second metal layers 180 and 190 may be sequentially formed.

Figure 6E:
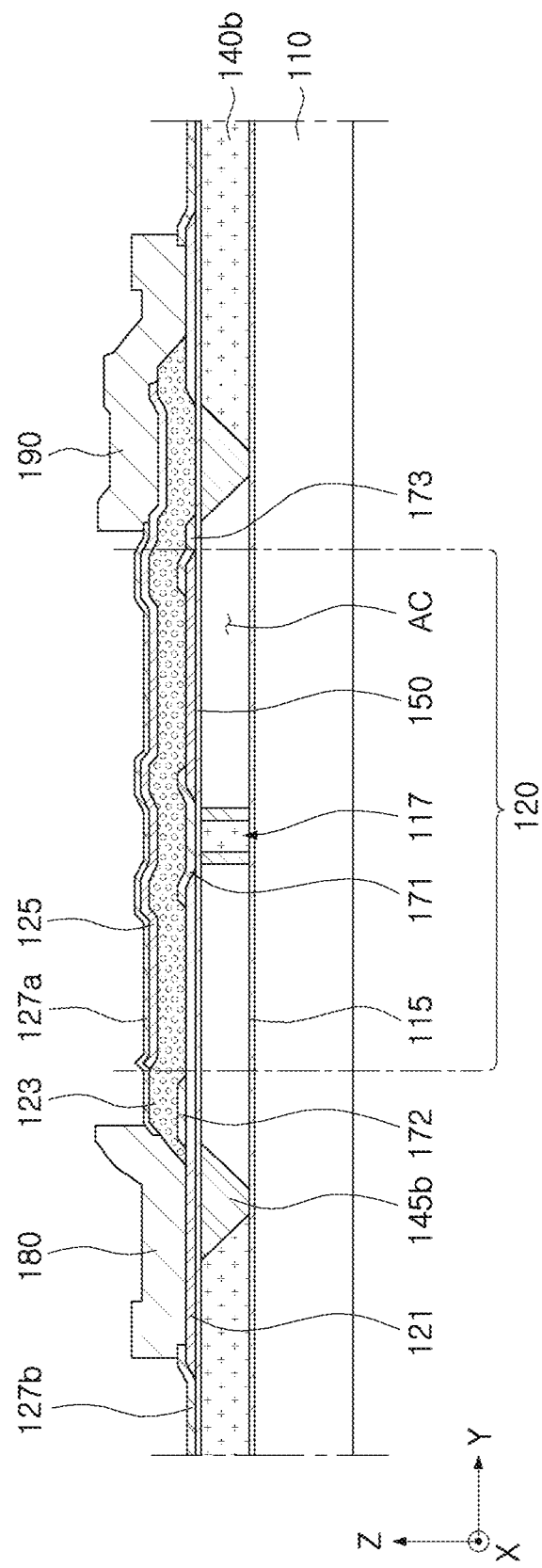

Referring to FIG. 6E, the cavity AC may be formed in accordance with removal (for example: etching) of a portion of the support unit 140*a* located inside the etch stop layer 145. When the support unit 140*a* is formed of a material such as polysilicon, polymer, or the like, the portion of the support unit 140*a* may be removed by a dry etching method using a halide-based etching gas such as fluorine (F), chlorine (Cl), or the like (for example, $XeF_2$). As a result of removing the portion of the support unit 140*a*, the support unit 140 is formed.

Then, a process of further etching the thickness of the protective layer may be performed to obtain a desired frequency characteristic.

Figure 7A:
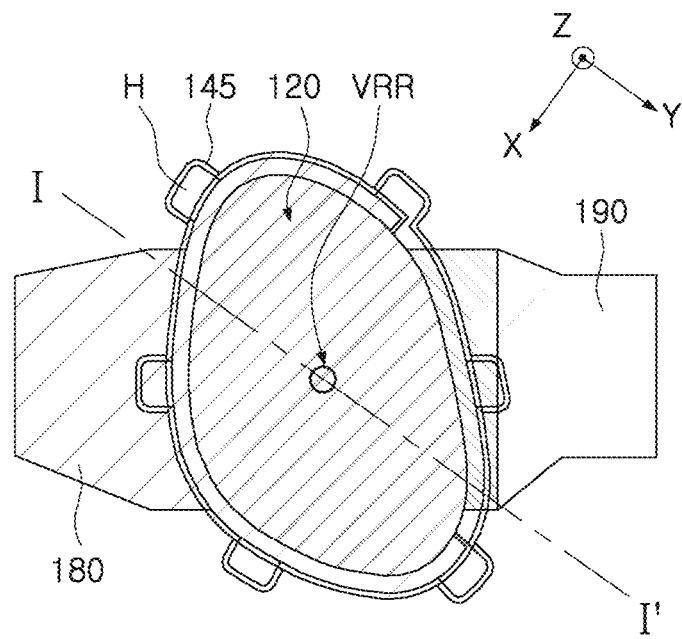
FIGS. 7A to 7C are plan views illustrating an acoustic resonator, according to an embodiment of the present disclosure.
Figure 7B:
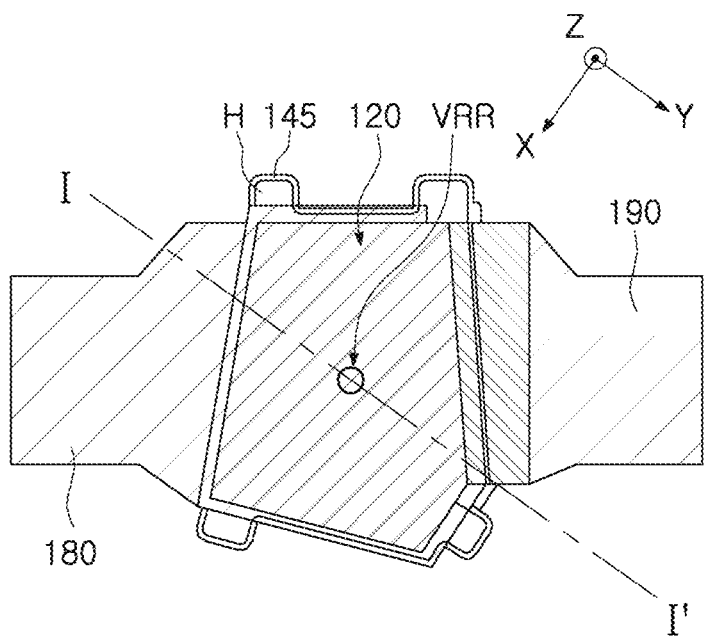
Figure 7C:
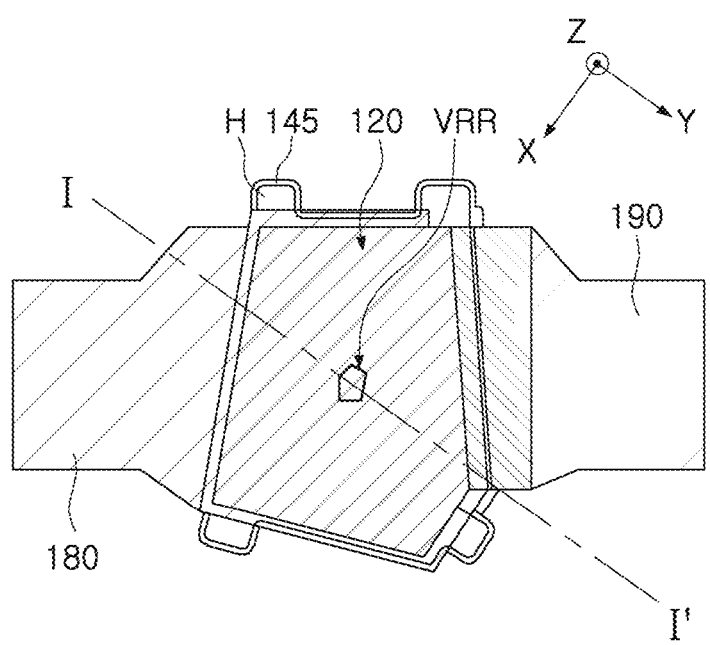

FIGS. 7A to 7C are plan views illustrating an acoustic resonator, according to an embodiment.

Referring to FIGS. 7A to 7C, a resonating unit 120 may be circular, irregular elliptical, polygonal, or irregular polygonal, and the hole VRR may be circular, irregularly elliptical, polygonal, or irregularly polygonal, and may be disposed in the center of the resonating unit 120.

The acoustic resonators illustrated in FIGS. 1A to 6E show a cross-section between I and I', illustrated in FIGS. 7A to 7C.

An inlet hole H illustrated in FIGS. 7A to 7C may act as an inflow path of an etching gas of an etching solution, and may be utilized in forming the above-described cavity AC.

Figure 8A:
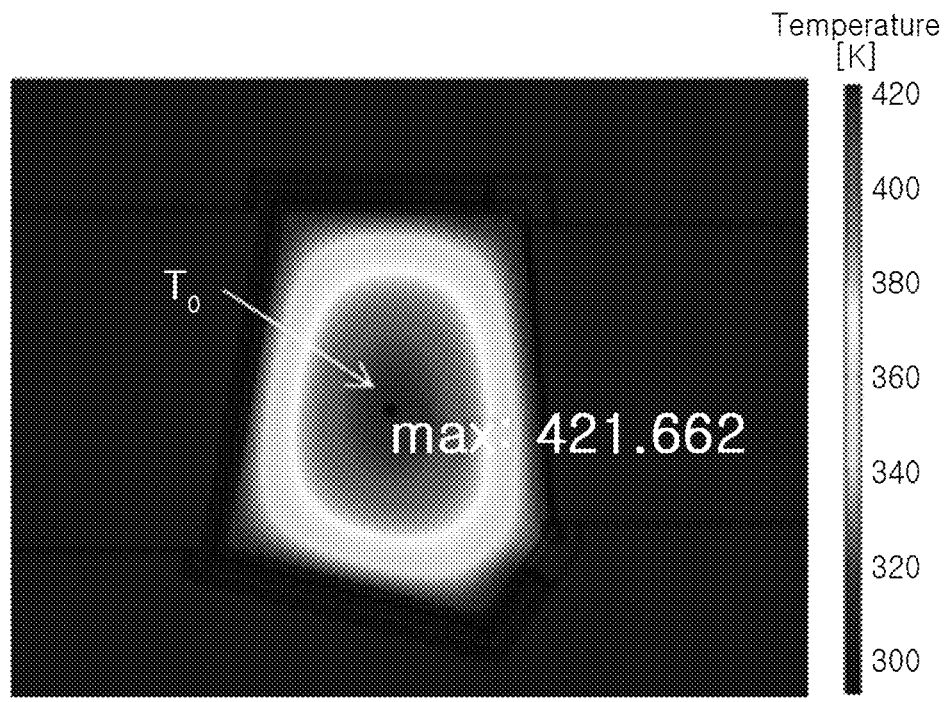
FIGS. 8A to 8C are plan views illustrating temperature distributions of an acoustic resonator, according to an embodiment.
Figure 8B:
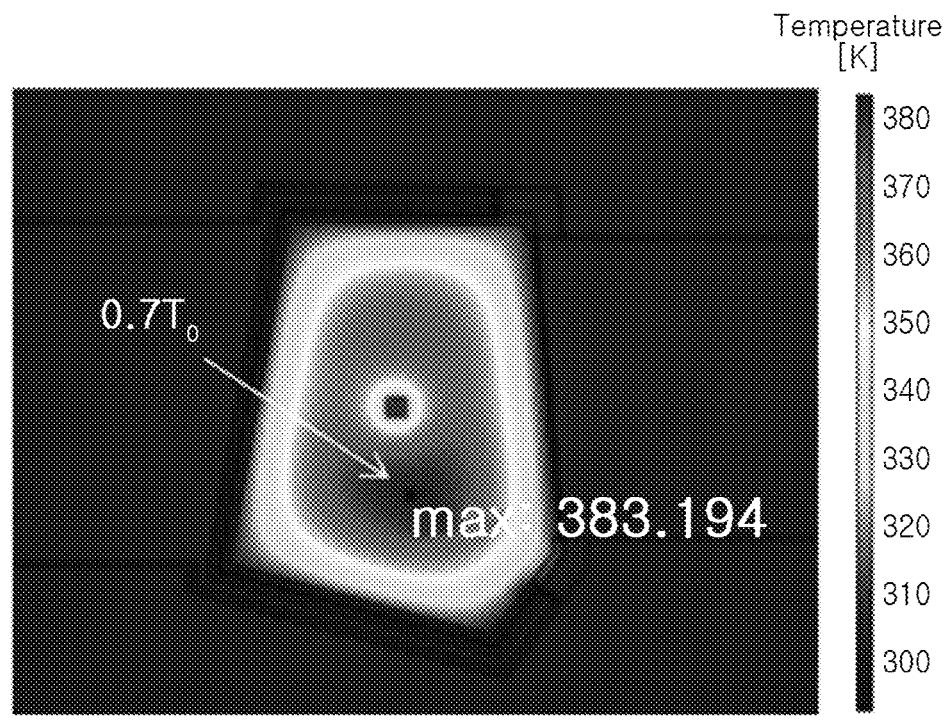
Figure 8C:
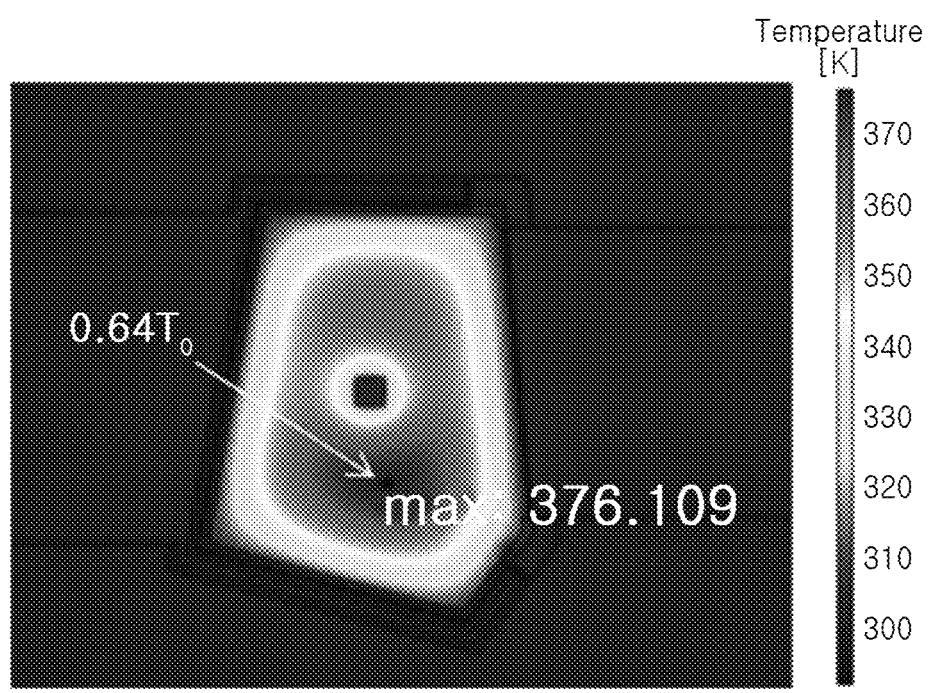

FIG. 8A is a plan view illustrating a temperature distribution of an acoustic resonator in which a pillar (e.g., the pillar 117 in FIGS. 1A-1D) is omitted, and FIGS. 8B and 8C are plan views illustrating a temperature distribution of an acoustic resonator according to an embodiment.

Referring to FIG. 8A, a temperature at a point having the highest temperature in the resonating unit of the acoustic resonator in which the pillar is omitted was $T_0$ (for example: 421.662K).

Referring to FIGS. 8B and 8C, a temperature of a portion corresponding to the point having the highest temperature in the resonating unit of FIG. 8A was lowered by the pillar.

Referring to FIG. 8B, in an example in which a radius of an upper surface of the pillar was 3 μm, the temperature at the point having the highest temperature in the resonating unit of the acoustic resonator was about 0.7 times (based on Celsius) of $T_0$ (for example: 421.662K).

Referring to FIG. 8C, in an example in which a radius of an upper surface of the pillar was 5 μm, a temperature at a point having the highest temperature in the resonating unit of the acoustic resonator was about 0.64 times of $T_0$ (based on Celsius).

For example, the pillar may be disposed at a point having the highest temperature in the acoustic resonator in which the pillar is omitted, but a specific position of the pillar may be adaptively shifted to match a maximum temperature point moving according to the disposition of the pillar, and may be optimized depending on the shape of the acoustic resonator and the external environment.

Figure 9A:
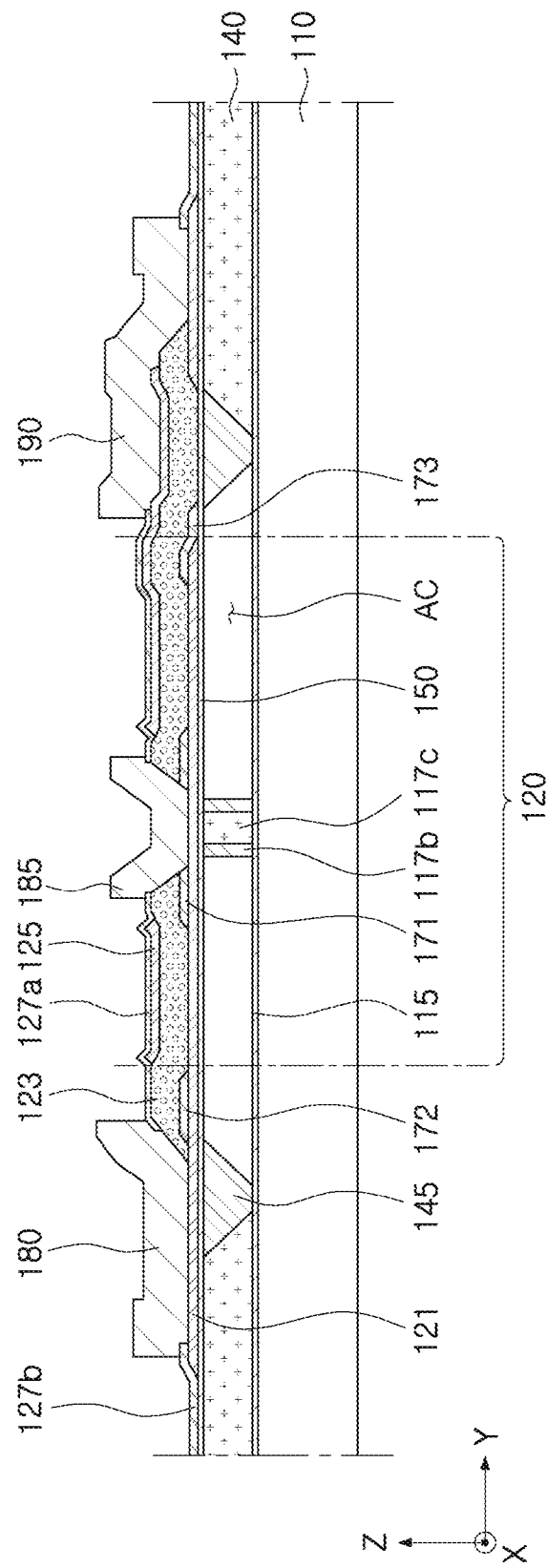
FIG. 9A is a side view illustrating an acoustic resonator and an intermediate metal layer according to an embodiment of the present disclosure.

FIG. 9A is a side view illustrating an acoustic resonator and an intermediate metal layer according to an embodiment of the present disclosure.

Referring to FIG. 9A, an acoustic resonator according to an embodiment of the present disclosure may include a resonator 120 and an intermediate metal layer 185.

The intermediate metal layer 185 is separated from a second electrode 125 and is disposed in a resonating unit 120 such that at least a portion thereof is surrounded by a piezoelectric layer 123 and the second electrode 125 in a horizontal direction (e.g., in a x direction and/or a y direction).

Accordingly, the intermediate metal layer 185 may absorb heat from the surrounding piezoelectric layer 123 and/or the second electrode 125 in the horizontal direction, and the intermediate metal layer 185 may radiate the absorbed heat to a pillar including a thermally conductive layer 117*c* or upwardly thereof.

In addition, since the intermediate metal layer 185 may prevent vibrations of the resonating unit 120 from being directed to the pillar including the thermally conductive layer 117*c*, vibration leakage may be reduced.

Therefore, the acoustic resonator according to an embodiment of the present disclosure may reduce vibration leakage while securing a heat radiation performance, thereby securing basic performance (e.g., quality factor (QF), and electromechanical coupling constant (Kt2)).

For example, the intermediate metal layer 185 may be formed of a material such as gold (Au), a gold-tin (Au—Sn) alloy, copper (Cu), a copper-tin (Cu—Sn) alloy, aluminum (Al), an aluminum-germanium (Al—Ge) alloy, and the like.

For example, the intermediate metal layer 185 may be formed by etching a predetermined portion of each of the piezoelectric layer 123 and the second electrode 125 while the piezoelectric layer 123 and the second electrode 125 are formed, and applying/depositing a material corresponding to the intermediate metal layer 185 to the predetermined portion. For example, the intermediate metal layer 185 may be formed together at the time of forming first and second metal layers 180 and 190.

For example, the intermediate metal layer 185 may include the same material as a material of at least a portion of the first and second metal layers 180 and 190. Accordingly, since the intermediate metal layer 185 may be formed together at the time of forming the first and second metal layers 180 and 190 in the manufacturing process, reliability of the intermediate metal layer 185 may be easily secured.

For example, the intermediate metal layer 185 may include a material different from the first and second electrodes 121 and 125 (e.g., Au). Accordingly, since the intermediate metal layer 185 may have a material having higher thermal conductivity more freely than the first and second electrodes 121 and 125, the intermediate metal layer 185 may absorb heat more efficiently from the surrounding piezoelectric layer 123 and/or the second electrode 125, and the heat radiation performance of the acoustic resonator according to an embodiment of the present disclosure may be further improved.

Referring to FIG. 9A, an acoustic resonator according to an embodiment of the present disclosure may further include a first insertion layer 171 and/or second insertion layers 172 and 173.

For example, the first insertion layer 171 may be disposed such that at least a portion thereof is positioned between the intermediate metal layer 185 and the first electrode 121. For example, the first insertion layer 171 may surround at least a portion of the intermediate metal layer 185. For example, the intermediate metal layer 185 may contact the first insertion layer 171.

Accordingly, since it may be efficiently suppressed that the vibrations of the resonating unit 120 seizes a gap between the intermediate metal layer 185 and the first electrode 121 and is directed to the pillar including the thermally conductive layer 117c, the basic performance of the acoustic resonator (e.g., quality factor (QF), electro-mechanical coupling constant (Kt2)) according to an embodiment of the present disclosure may be further improved.

For example, the intermediate metal layer 185 may be formed by etching a predetermined portion of the first insertion layer 171 while the first insertion layer 171 is formed, and applying/depositing a material corresponding to the intermediate metal layer 185 to the predetermined portion.

Second insertion layers 172 and 173 may be disposed further (outwardly from the thermally conductive layer 117c than the first insertion layer 171 in the horizontal direction. Accordingly, the second insertion layers 172 and 173 may suppress vibrations of the resonating unit 120 from leaking outwardly.

Referring to FIG. 9A, the acoustic resonator according to an embodiment of the present disclosure may further include a first etch stop layer 145 and/or a second etch stop layer 117b. Accordingly, a support unit 140 may have a cavity AC having a relatively higher reliability.

Here, the thermally conductive layer 117c may be surrounded by the second etch stop layer 117b, and may be made of a material different from that of the second etch stop layer 117b. Accordingly, the thermally conductive layer 117c may more efficiently radiate the heat absorbed by the intermediate metal layer 185 to a substrate 110.

Meanwhile, the pillar may be omitted in the acoustic resonator according to an embodiment of the present disclosure. That is, since the heat adsorbed by the intermediate metal layer 185 may also radiate upwardly thereof, when the acoustic resonator according to an embodiment of the present disclosure includes an intermediate metal layer 185, the acoustic resonator according to an embodiment of the present disclosure may have improved heat generation performance according to the intermediate metal layer 185 without the pillar including the thermally conductive layer 117c and the cavity AC, and since it does not have a vibration leakage path such as the pillar, the basic performance (e.g., quality factor (QF), electro-mechanical coupling constant (Kt2)) can be secured.

Figure 9B:
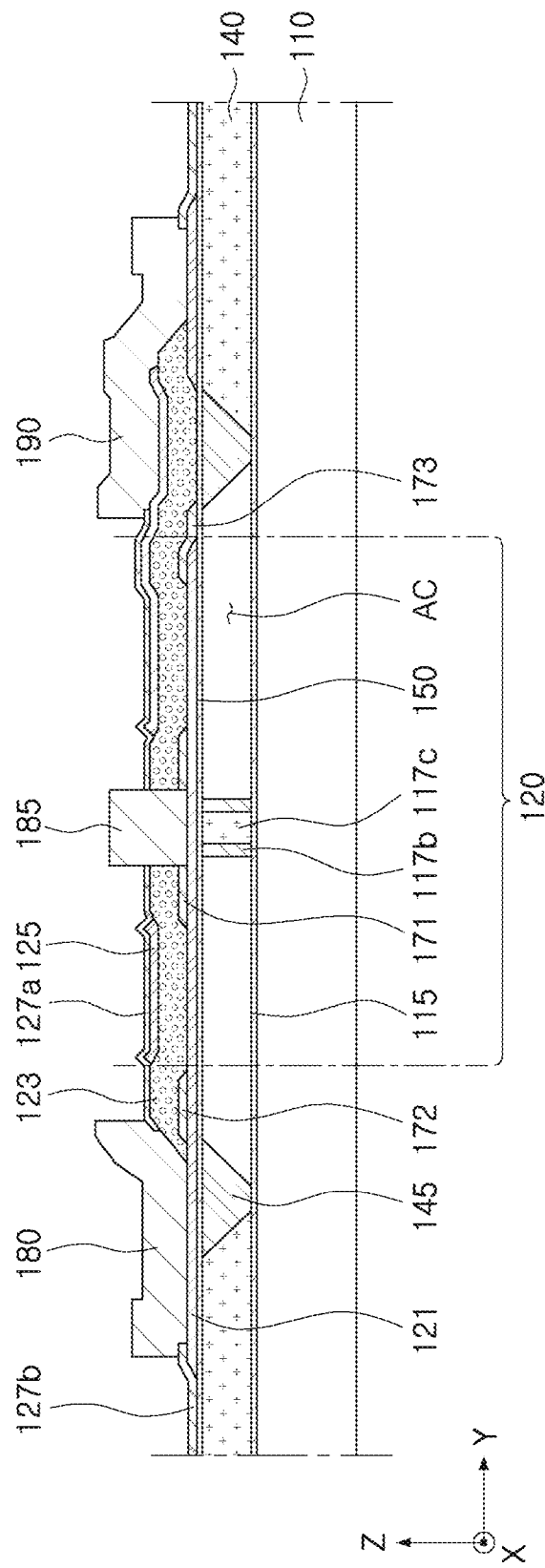
FIG. 9B is a side view illustrating a first modified structure of the intermediate metal layer of the acoustic resonator according to an embodiment of the present disclosure.

FIG. 9B is a side view illustrating a first modified structure of an intermediate metal layer of an acoustic resonator according to an embodiment of the present disclosure.

Referring to FIG. 9B, an interface between the intermediate metal layer 185 and the piezoelectric layer 123 of the acoustic resonator according to an embodiment of the present disclosure may be perpendicular to the first electrode 121.

In contrast thereto, referring to FIG. 9A, an interface between the intermediate metal layer 185 and the piezoelectric layer 123 of the acoustic resonator according to an embodiment of the present disclosure may be oblique to the first electrode 121.

According to a structure corresponding FIG. 9A, since the intermediate metal layer 185 may be formed on an oblique interface of the piezoelectric layer 123 with relatively higher reliability, the intermediate metal layer 185 may absorb heat more efficiently from the piezoelectric layer 123 and/or the second electrode 125, the heat radiation performance of the acoustic resonator according to an embodiment of the present disclosure can be further improved.

Figure 9C:
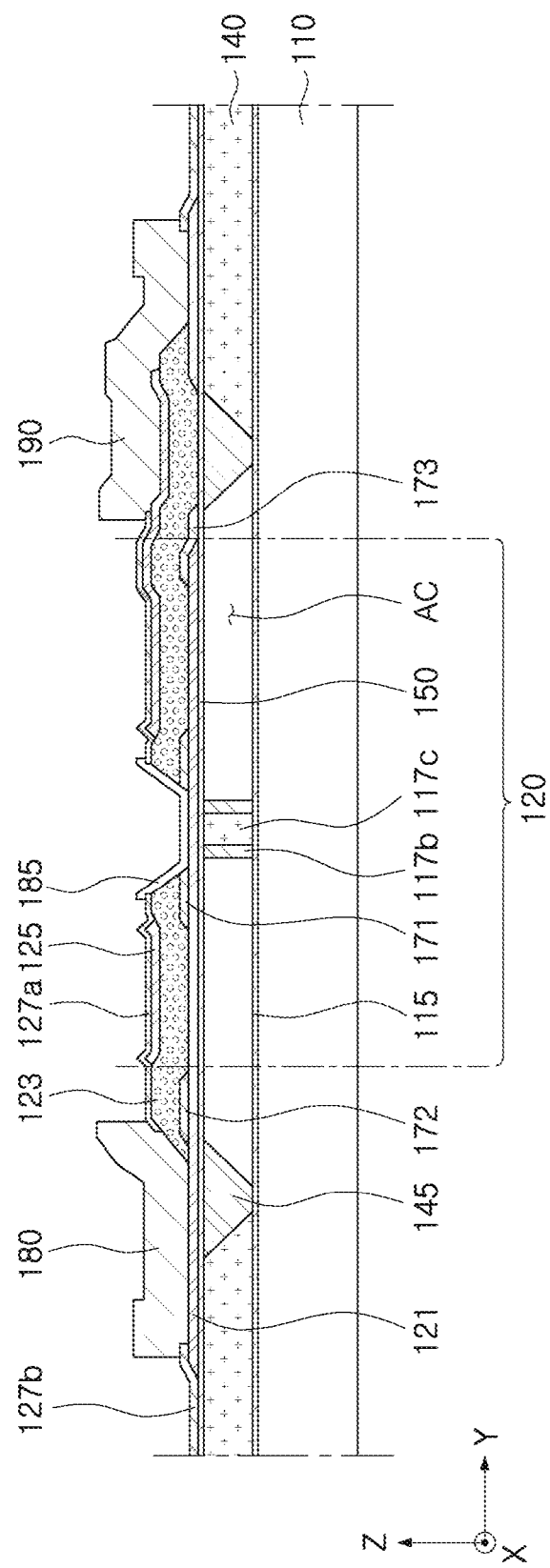
FIG. 9C is a side view illustrating a second modified structure of the intermediate metal layer of the acoustic resonator according to an embodiment of the present disclosure.

FIG. 9C is a side view illustrating a second modified structure of an intermediate metal layer of an acoustic resonator according to an embodiment of the present disclosure.

Referring to FIG. 9C, a thickness of the intermediate metal layer 185 of the acoustic resonator according to an embodiment of the present disclosure may be equal to or less than a thickness of the second electrode 125.

In contrast, referring to FIG. 9A, the thickness of the intermediate metal layer 185 may be thicker than the thickness of the second electrode 125.

According to a structure corresponding FIG. 9A, since the intermediate metal layer 185 may have a larger heat accommodation capacity, the intermediate metal layer 185 may absorb heat from the piezoelectric layer 123 and/or the second electrode 125, and the heat radiation performance of the acoustic resonator according to an embodiment of the present disclosure may be further improved.

Figure 9D:
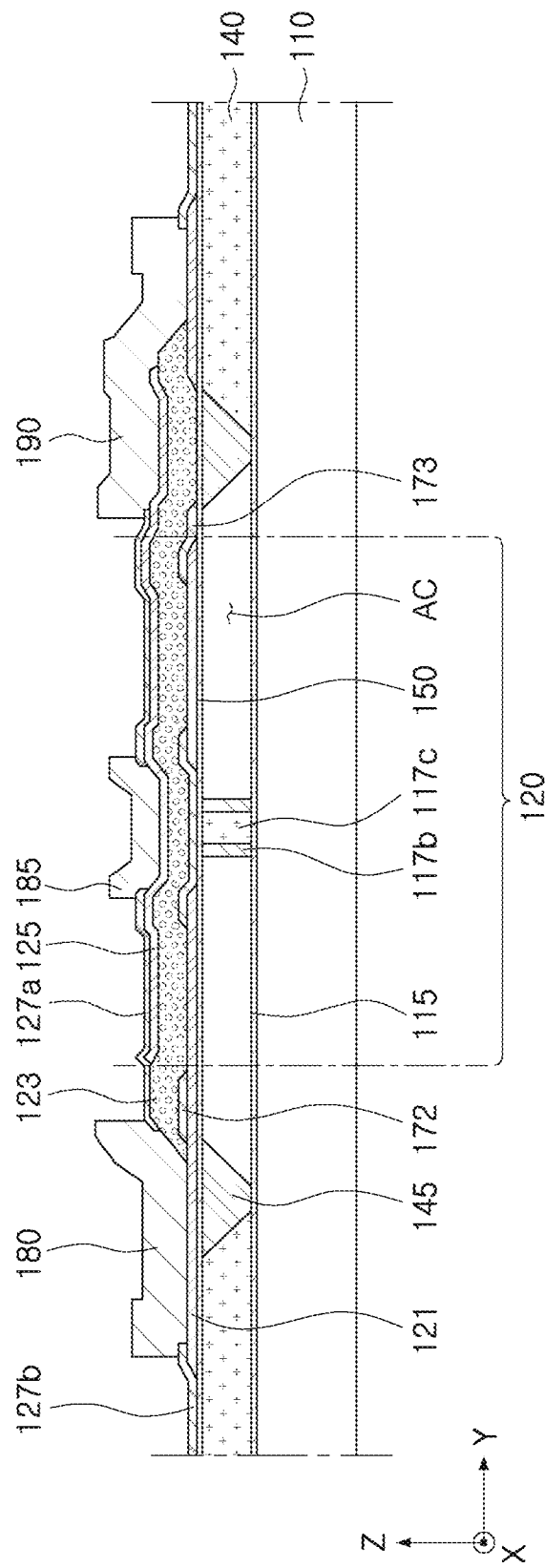
FIG. 9D is a side view illustrating a third modified structure of the intermediate metal layer of the acoustic resonator according to an embodiment of the present disclosure.

FIG. 9D is a side view illustrating a third modified structure of an intermediate metal layer of an acoustic resonator according to an embodiment of the present disclosure.

Referring to FIG. 9D, the intermediate metal layer 185 of the acoustic resonator according to an embodiment of the present disclosure may be separated from the first electrode 121.

In contrast, referring to FIG. 9A, the intermediate metal layer 185 according to an embodiment of the present disclosure may be electrically connected to the first electrode 121.

According to a structure corresponding FIG. 9A, the intermediate metal layer 185 may more efficiently radiate the heat absorbed from the piezoelectric layer 123 and/or the second electrode 125 to the pillar including the thermally conductive layer 117c through the first electrode 121.

According to the design, the intermediate metal layer 185 may be electrically connected to the second electrode 125 when electrically separated from the first electrode 121.

For example, the intermediate metal layer 185 may be disposed on an upper surface of the second electrode 125 in a position overlapping the pillar including the thermally conductive layer 117*c* in an up-and-down direction.

Accordingly, in a structure in which the intermediate metal layer 185 and the second electrode 125 are coupled, a heat accommodation capacity may be concentrated on the intermediate metal layer 185, such that the intermediate metal layer 185 may absorb overall heat of the resonating unit 120 more efficiently, and the heat radiation performance of the acoustic resonator according to an embodiment of the present disclosure can be further improved.

Figure 9E:
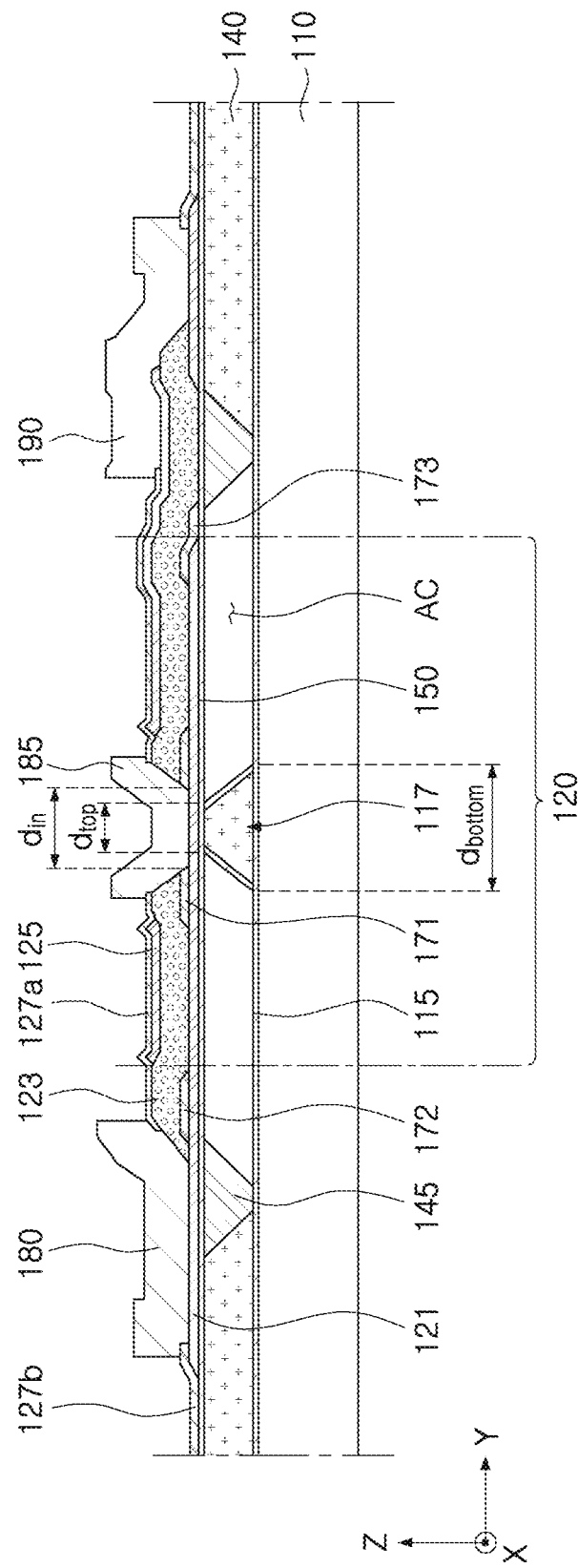
FIG. 9E is a side view illustrating a first modified structure of a pillar of the acoustic resonator of FIG. 9A.
Figure 9F:
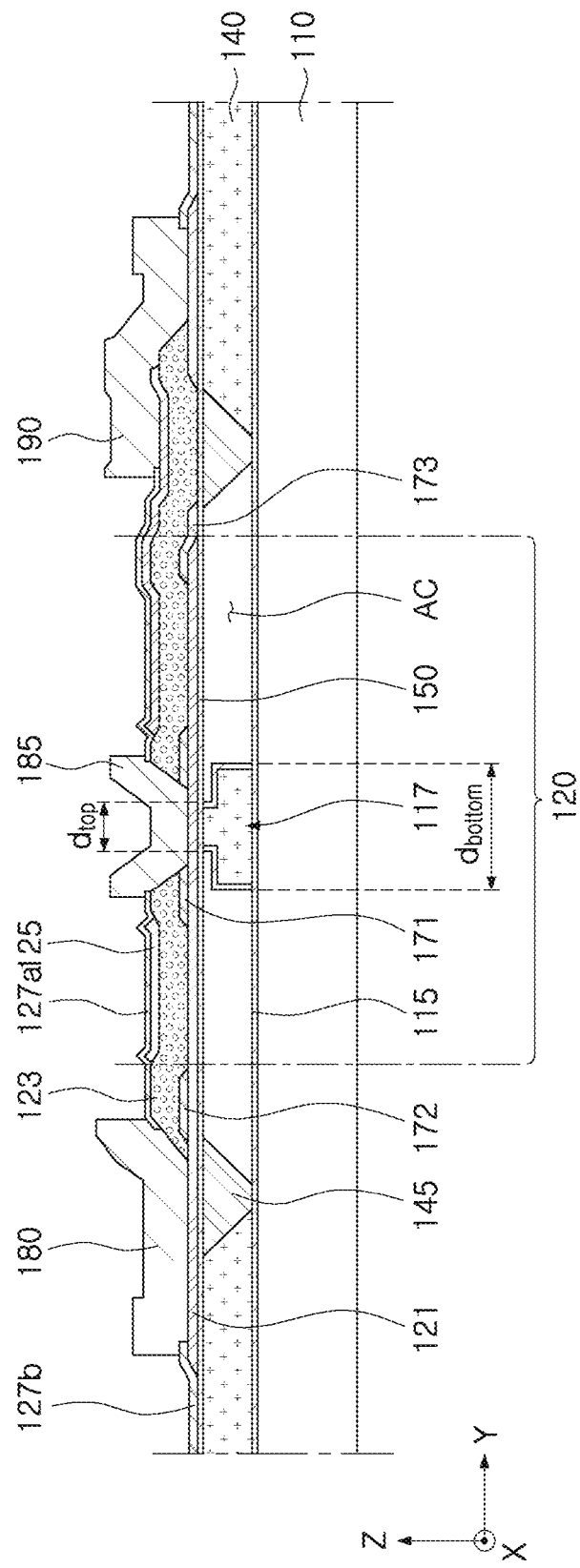
FIG. 9F is a side view illustrating a second modified structure of a pillar of the acoustic resonator of FIG. 9A.

FIG. 9E is a side view illustrating a first modified structure of the pillar of the acoustic resonator of FIG. 9A, and FIG. 9F is a side view illustrating a second modified structure of the pillar of the acoustic resonator of FIG. 9A.

Referring to FIGS. 9E and 9F, the pillar 117 of the acoustic resonator according to an embodiment of the present disclosure may be configured such that a width ($d_{bottom}$) of the lower surface thereof is larger than a width ($d_{top}$) of the upper surface thereof.

Accordingly, the pillar 117 may more efficiently radiate heat absorbed by the intermediate metal layer 185 to the substrate 110.

Figure 9G:
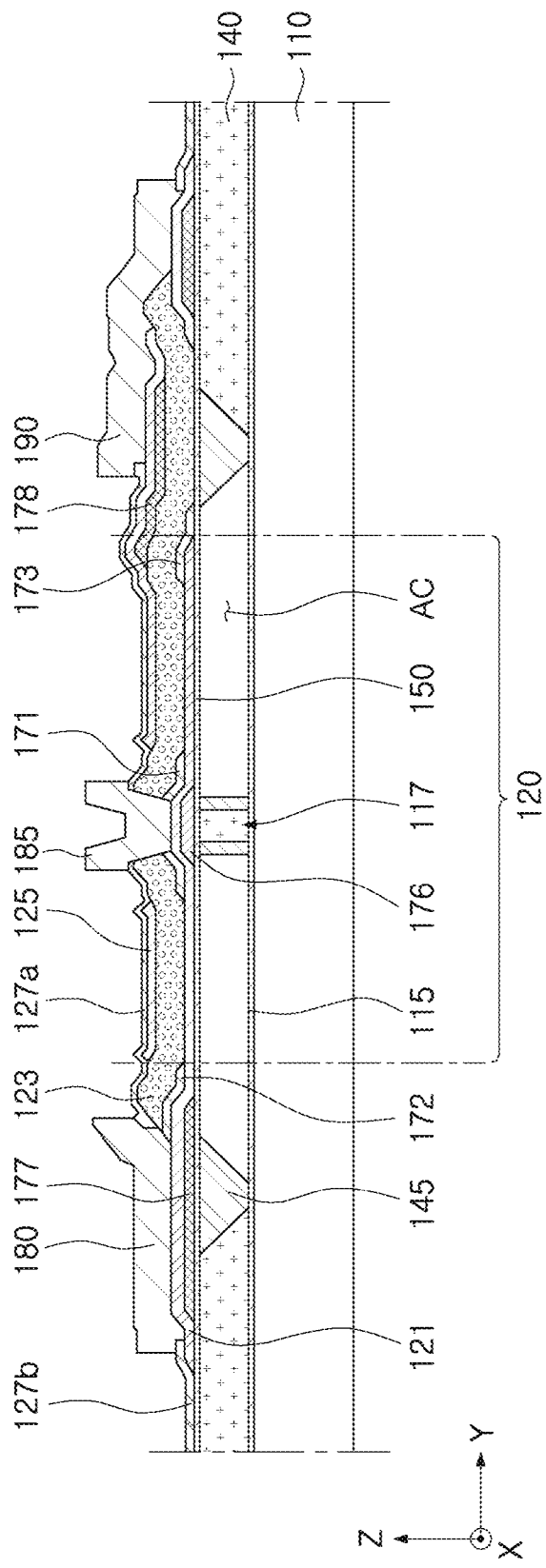
FIG. 9G is a side view illustrating a structure in which a metal insertion layer is added to the acoustic resonator of FIG. 9A.

FIG. 9G is a side view illustrating a structure in which a metal insertion layer is added to the acoustic resonator of FIG. 9A.

Referring to FIG. 9G, in the acoustic resonator according to an embodiment of the present disclosure, the resonating unit 120 may further include a first metal insertion layer 176 disposed on a lower side of the intermediate metal layer 185 and disposed between the pillar 117 and the first electrode 121.

Accordingly, since the first electrode 121 may have a structure that is easily to be protruded from a lower side to an upper side of the intermediate metal layer 185, heat of the intermediate metal layer 185 may be efficiently absorbed through the protruding portion of the first electrode 121. The heat absorbed by the first electrode 121 may be radiated to the pillar 117 through the first metal insertion layer 176.

Referring to FIG. 9G, the acoustic resonator according to an embodiment of the present disclosure may further include second metal insertion layers 177 and 178 disposed further outwardly from the pillar 117 than the first metal insertion layer 176 in the horizontal direction.

Figure 10A:
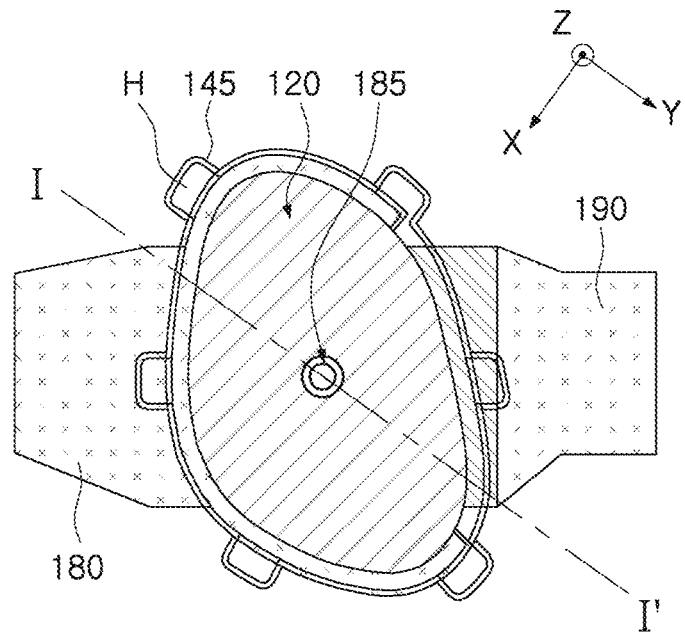
FIGS. 10A to 10C are plan views illustrating an acoustic resonator and an intermediate metal layer according to an embodiment of the present disclosure.
Figure 10B:
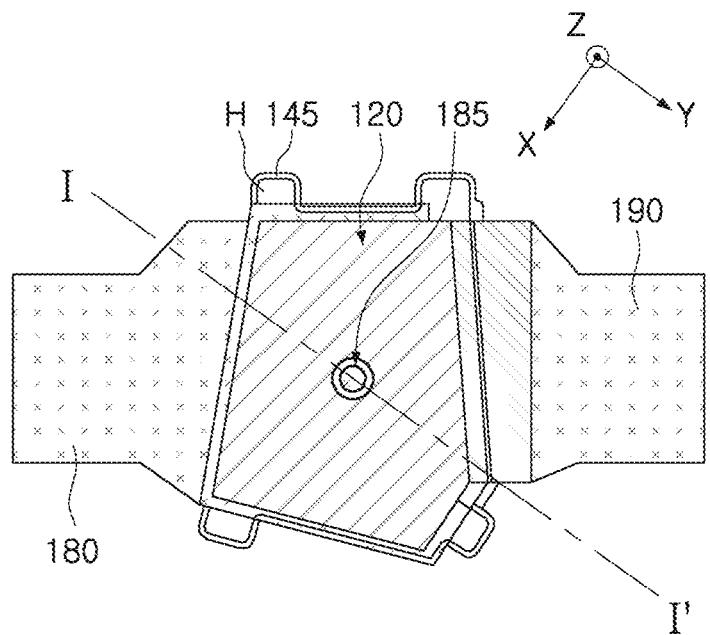
Figure 10C:
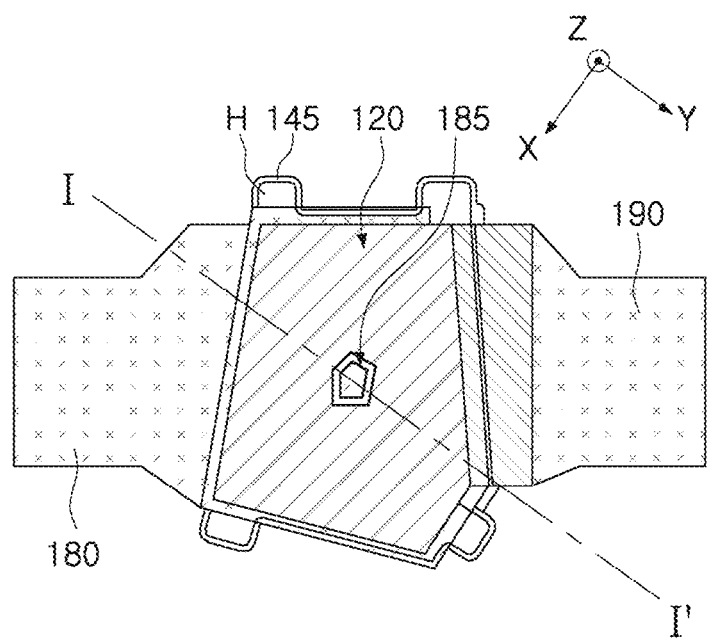

FIGS. 10A to 10C are plan views illustrating an acoustic resonator and an intermediate metal layer according to an embodiment of the present disclosure.

Referring to FIGS. 10A to 10C, the resonating unit 120 may be circular, atypically oval, polygonal, or atypically polygonal, and the intermediate metal layer 185 may be circular, atypically oval, polygonal, or atypically polygonal, and may be disposed in the center of the resonating unit 120.

The acoustic resonator shown in FIGS. 9A to 9G are side views illustrating a cross-section between I and I' in FIGS. 10A to 10C.

Meanwhile, an inflow hole H shown in FIGS. 10A to 10C may serve as an inflow path of etching gas or an etching solution, and may be used to form the cavity described above.

Figure 11A:
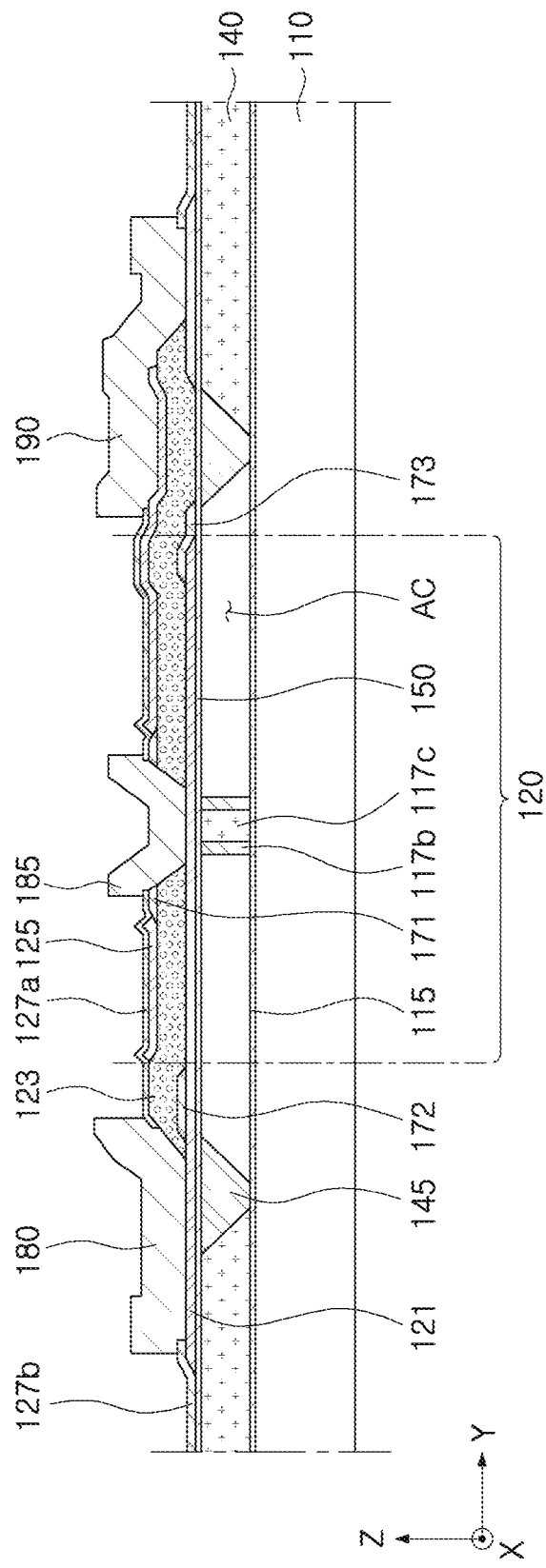
FIGS. 11A to 11C are side views illustrating a modified structure of an insertion layer of the acoustic resonator of FIG. 9A.
Figure 11B:
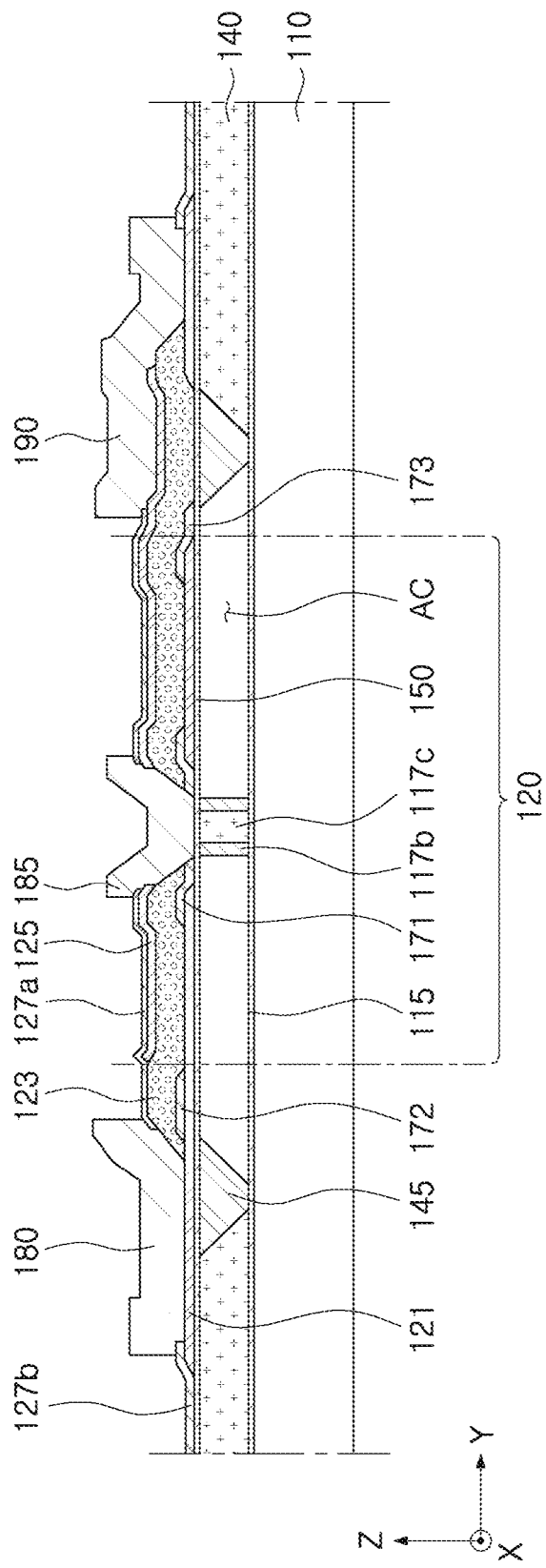
Figure 11C:
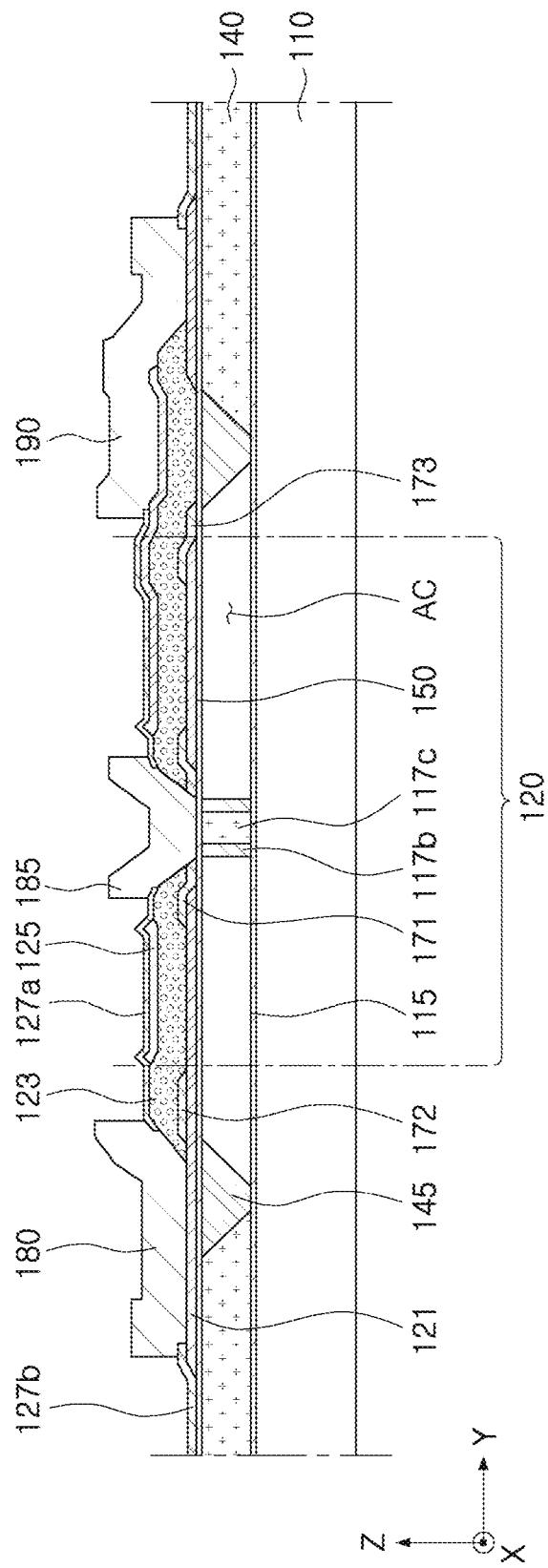
Figure 12A:
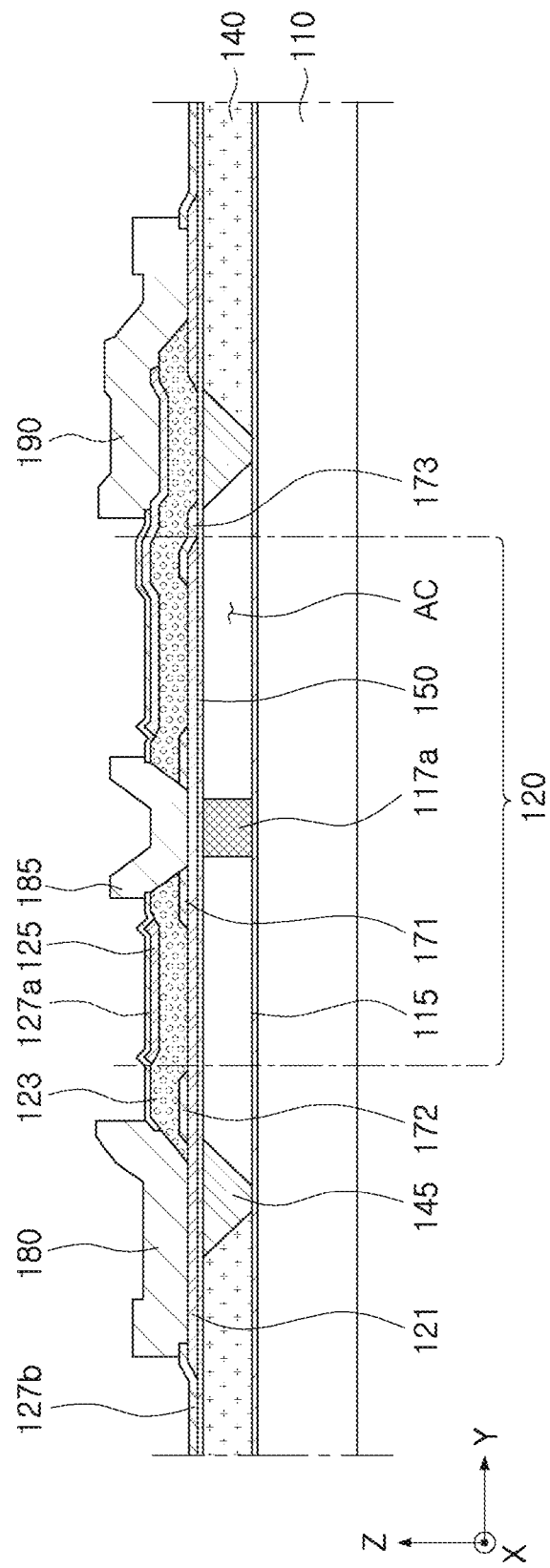
FIGS. 12A to 12D are side views illustrating a modified structure of the pillar of the acoustic resonator of FIG. 9A.
Figure 12B:
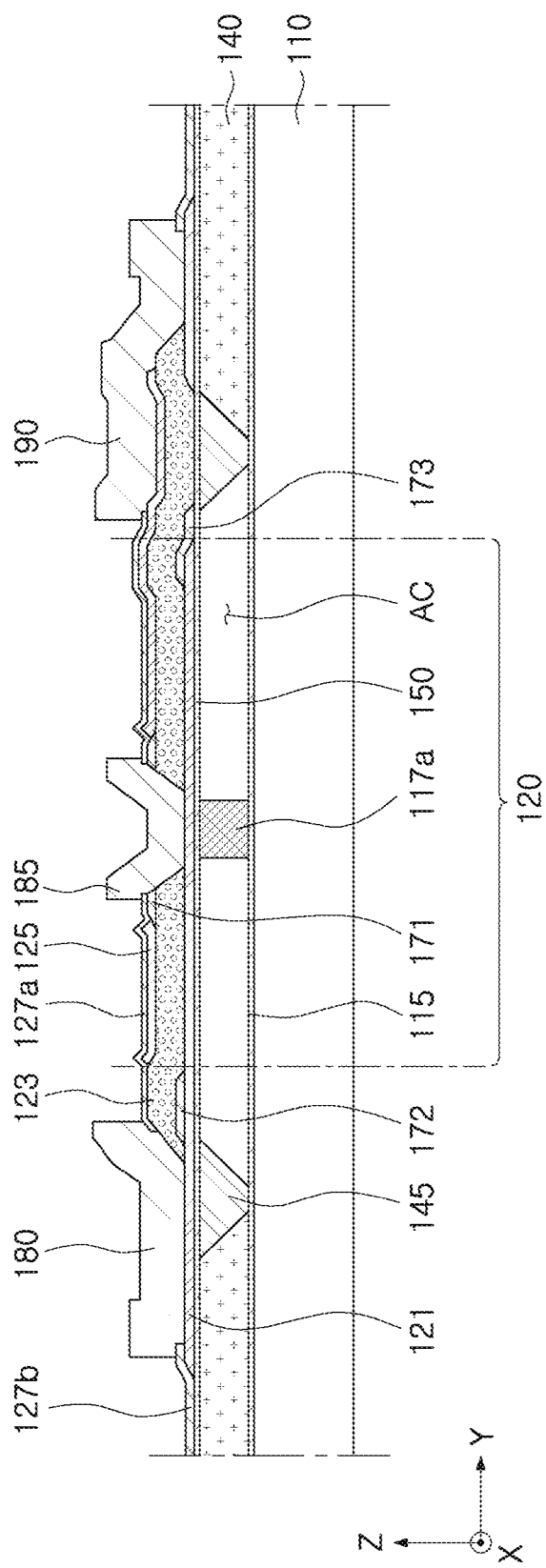
Figure 12C:
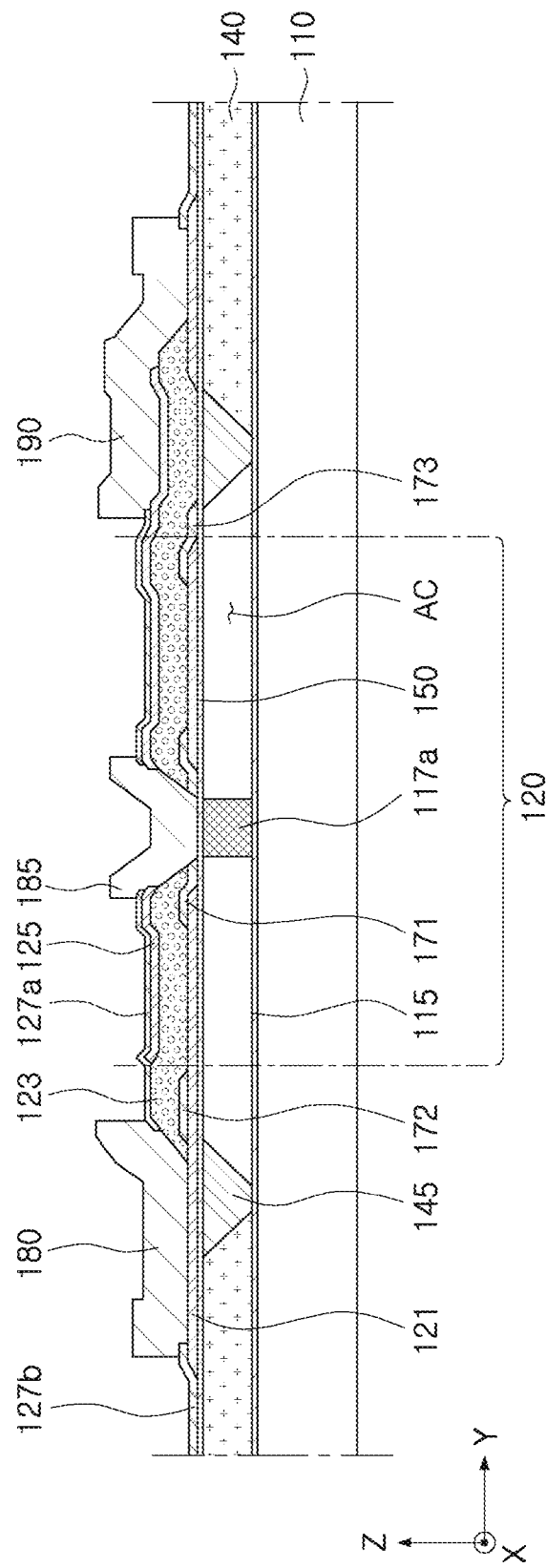
Figure 12D:
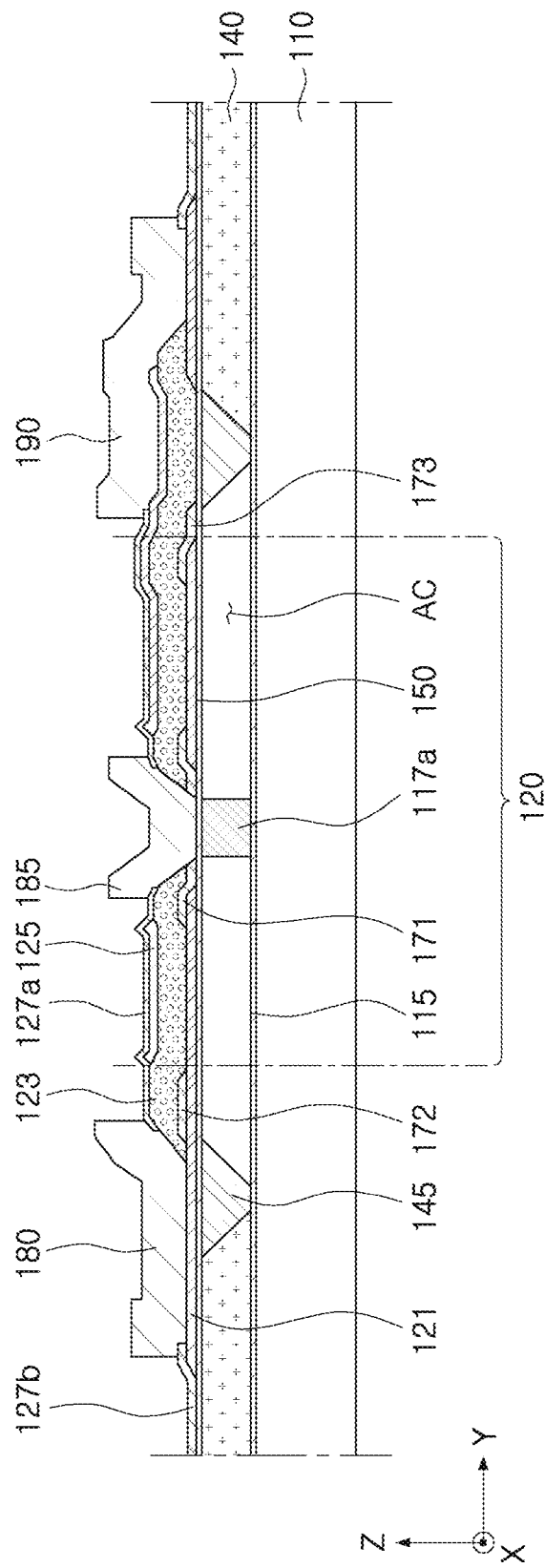

FIGS. 11A to 11C are side views illustrating a modified structure of an insertion layer of the acoustic resonator of FIG. 9A.

Referring to FIGS. 11A to 11C, the first insertion layer 171 may be disposed around the intermediate metal layer 185, and may reflect vibrations in the piezoelectric layer 123 in the horizontal direction.

Referring to FIG. 11A, the first insertion layer 171 may be disposed between the intermediate metal layer 185 and the second electrode 125 on an upper side of the piezoelectric layer 123. Accordingly, since insulation reliability between the intermediate metal layer 185 and the second electrode 125 may be further improved, when the intermediate metal layer 185 is electrically connected to the first electrode 121, a short between the first electrode 121 and the second electrode 125 may be prevented.

Referring to FIG. 11B, when the intermediate metal layer 185 is electrically connected to the second electrode 125, at least a portion of the first insertion layer 171 may be disposed between the intermediate metal layer 185 and the first electrode 121, and the insulation reliability between the intermediate metal layer 185 and the first electrode 121 may be further improved.

Referring to FIG. 11C, the intermediate metal layer 185 may be electrically insulated from each of the first and second electrodes 121 and 125, and the first insertion layer 171 may improve the insulation reliability between the first or second electrode 121 and 125 and the intermediate metal layer 185.

FIGS. 12A to 12D are side views illustrating a modified structure of the pillar of the acoustic resonator of FIG. 9A.

Referring to FIGS. 12A to 12D, a pillar 117*a* may be disposed on a lower side of the intermediate metal layer 185 in the cavity AC, and may be formed of a material different from that of the support unit 140 according to the design.

Figure 13A:
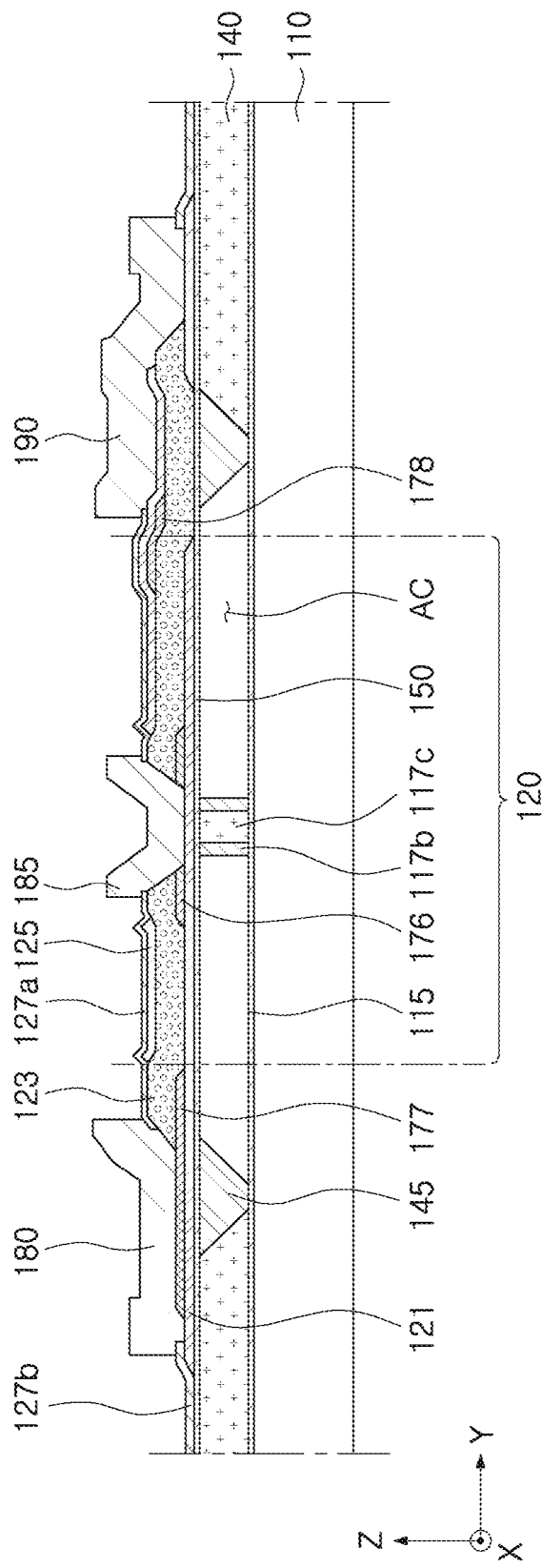
FIGS. 13A and 13B are side views illustrating a metal insertion layer of the acoustic resonator of FIG. 9A.
Figure 13B:
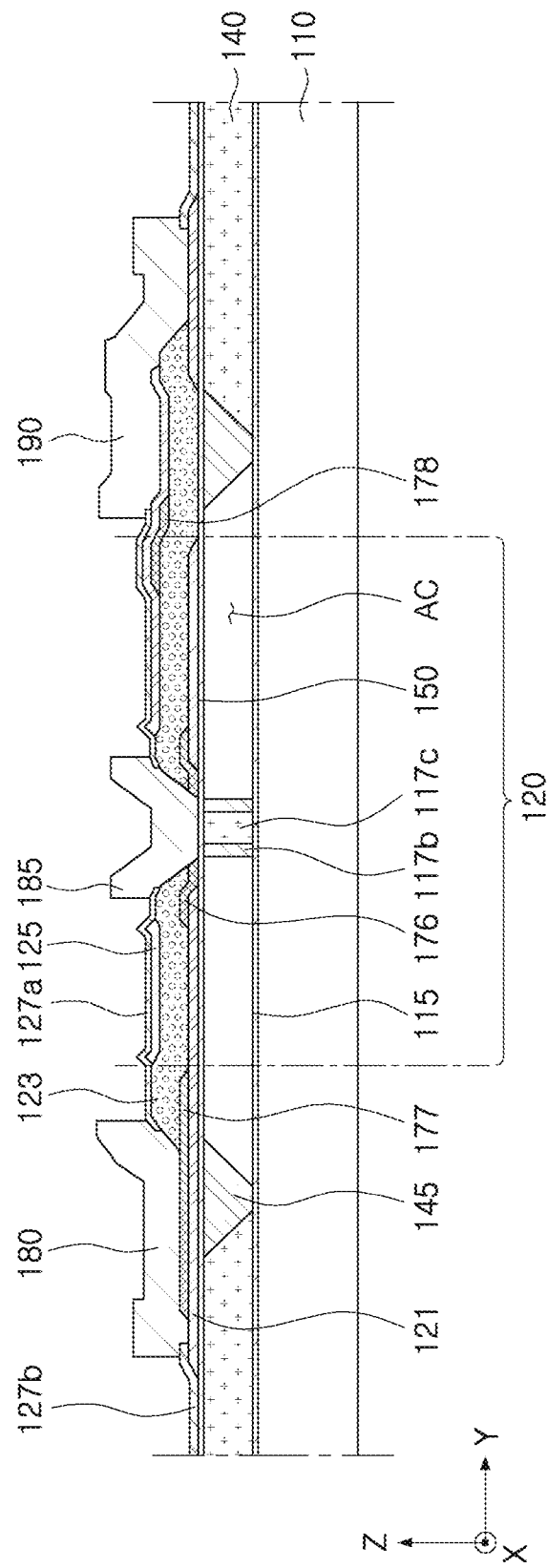

FIGS. 13A and 13B are side views illustrating a metal insertion layer of the acoustic resonator of FIG. 9A.

Referring to FIGS. 13A and 13B, the first metal insertion layer 176 may be disposed around the intermediate metal layer 185, and may reflect vibrations of the piezoelectric layer 123 in the horizontal direction.

The first metal insertion layer 176 may reflect vibrations of the piezoelectric layer 123 in the horizontal direction while electrically connecting between one of the first and second electrodes 121 and 125 and the intermediate metal layer 185.

FIGS. 14A to 14E are side views illustrating a modified structure of the acoustic resonator of FIG. 9D.

Figure 14A:
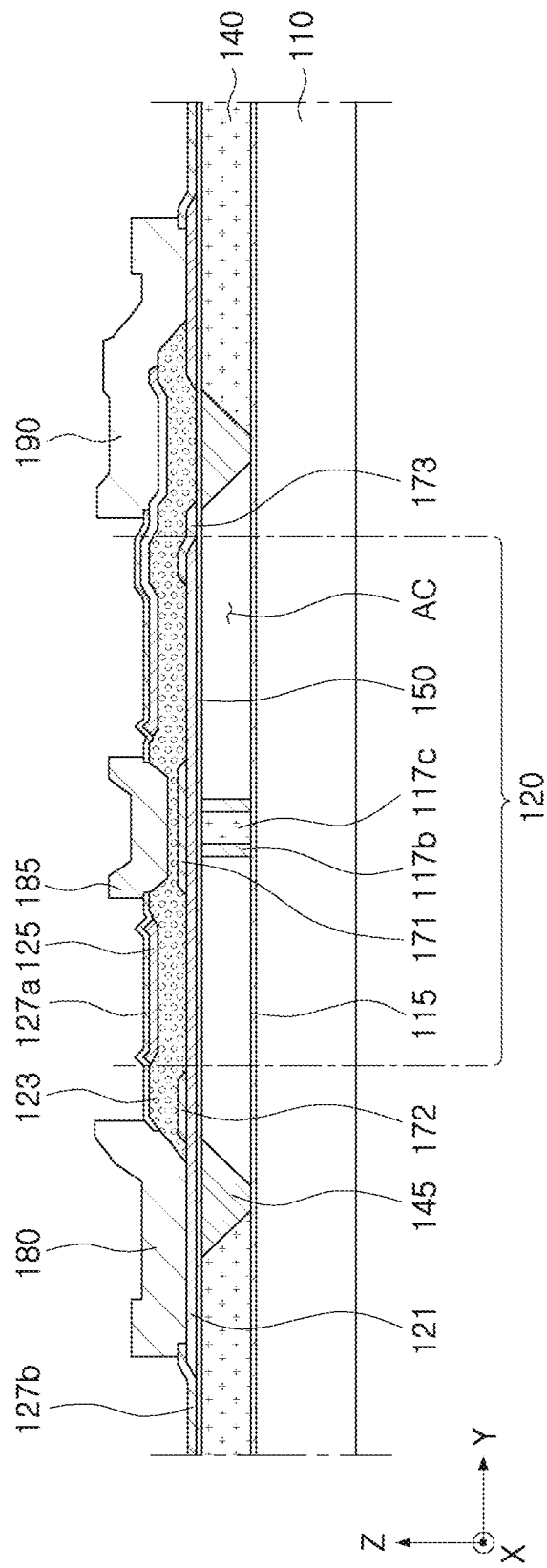
FIGS. 14A to 14E are side views illustrating a modified structure of the acoustic resonator of FIG. 9D.

Referring to FIG. 14A, the first insertion layer 171 may be separated from the intermediate metal layer 185 between the first electrode 121 and the intermediate metal layer 185.

Figure 14B:
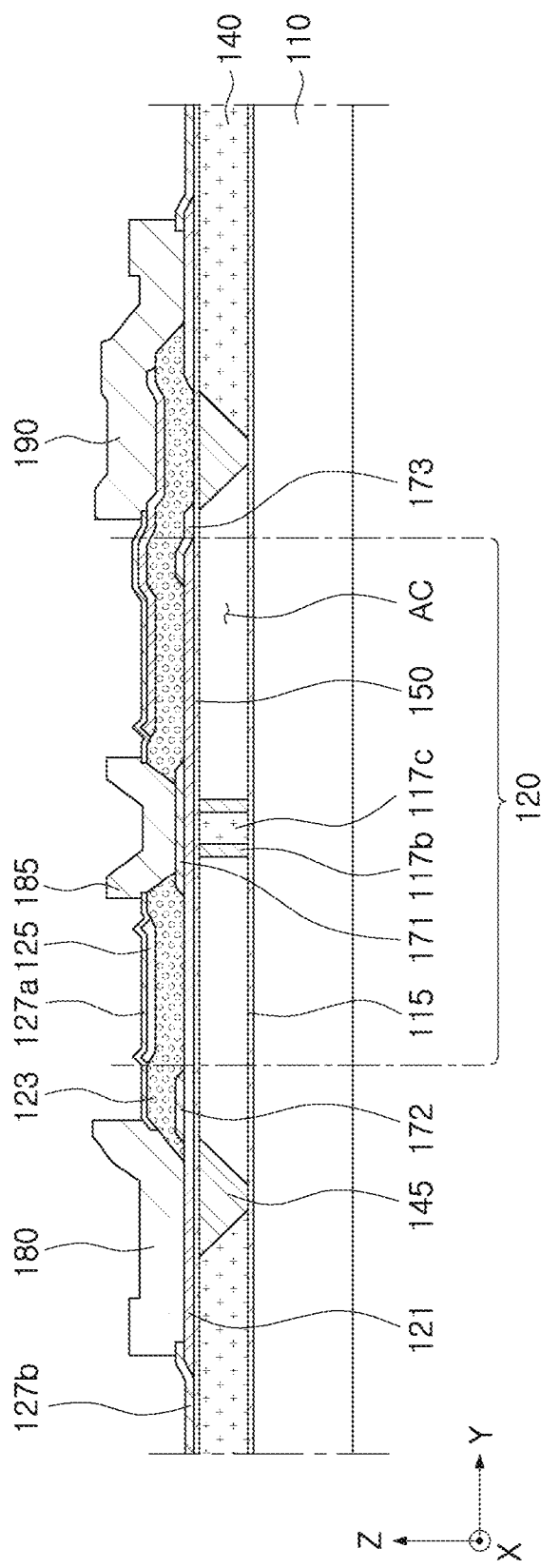

Referring to FIG. 14B, the first insertion layer 171 may contact the intermediate metal layer 185 between the first electrode 121 and the intermediate metal layer 185.

Figure 14C:
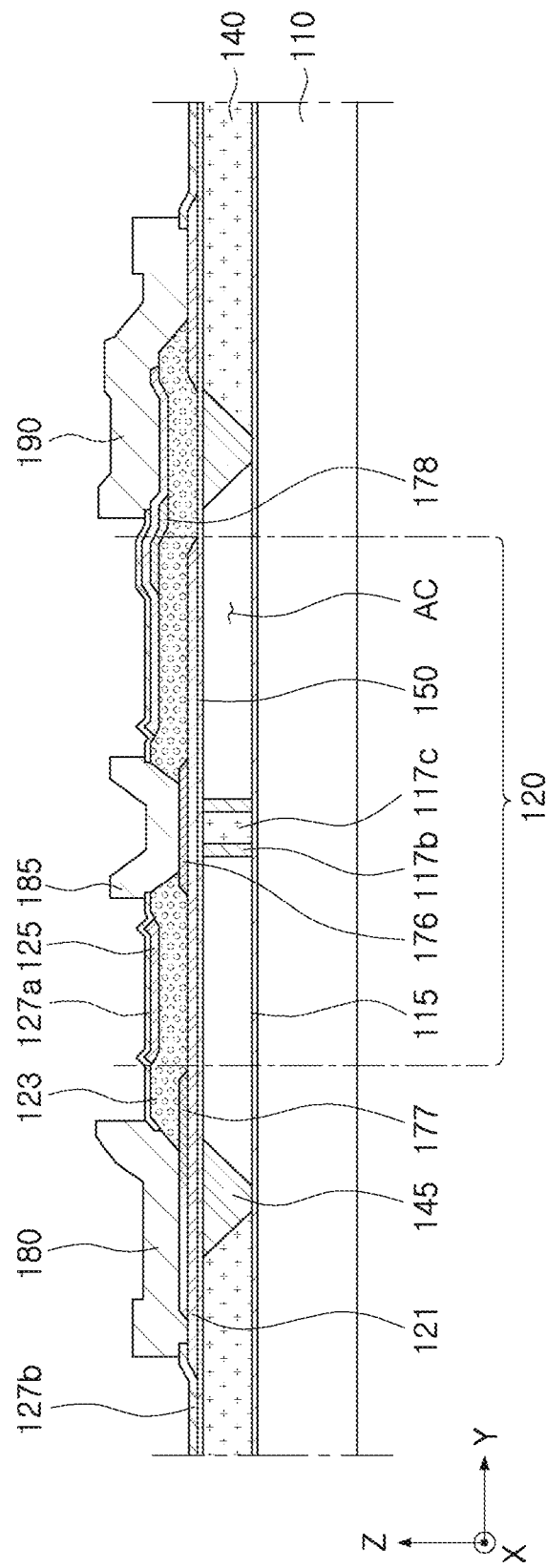

Referring to FIG. 14C, the first metal insertion layer 176 may be disposed between the first electrode 121 and the intermediate metal layer 185.

Figure 14D:
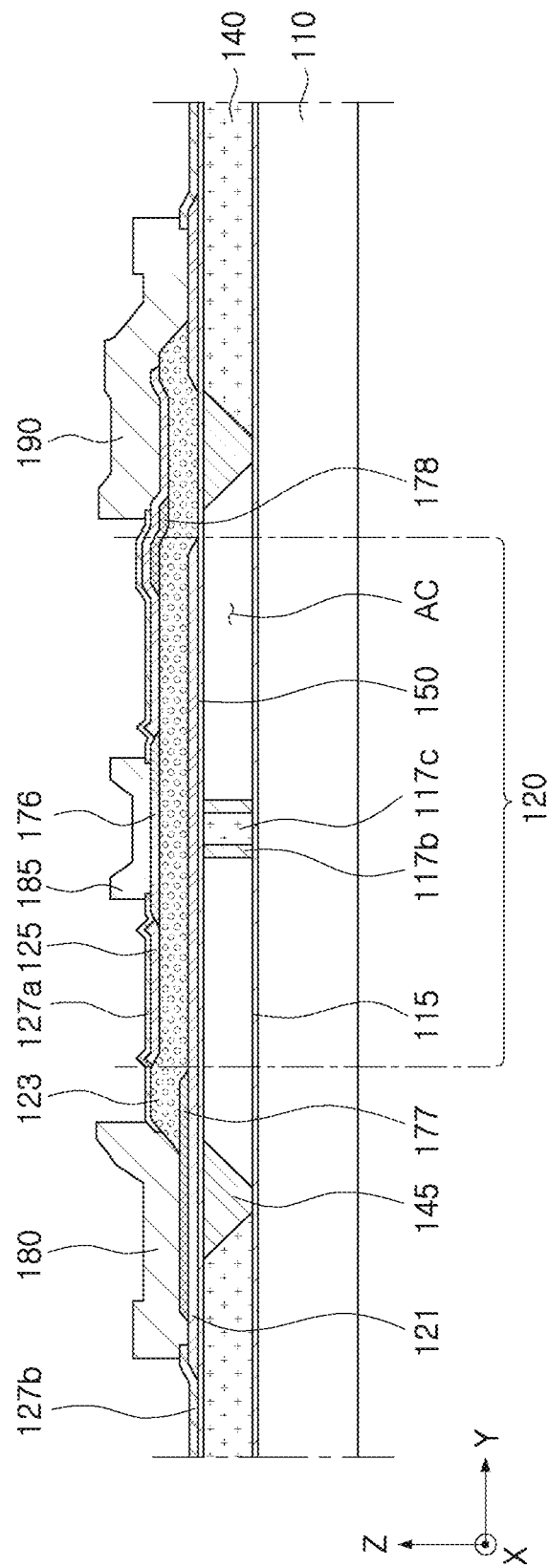
Figure 14E:
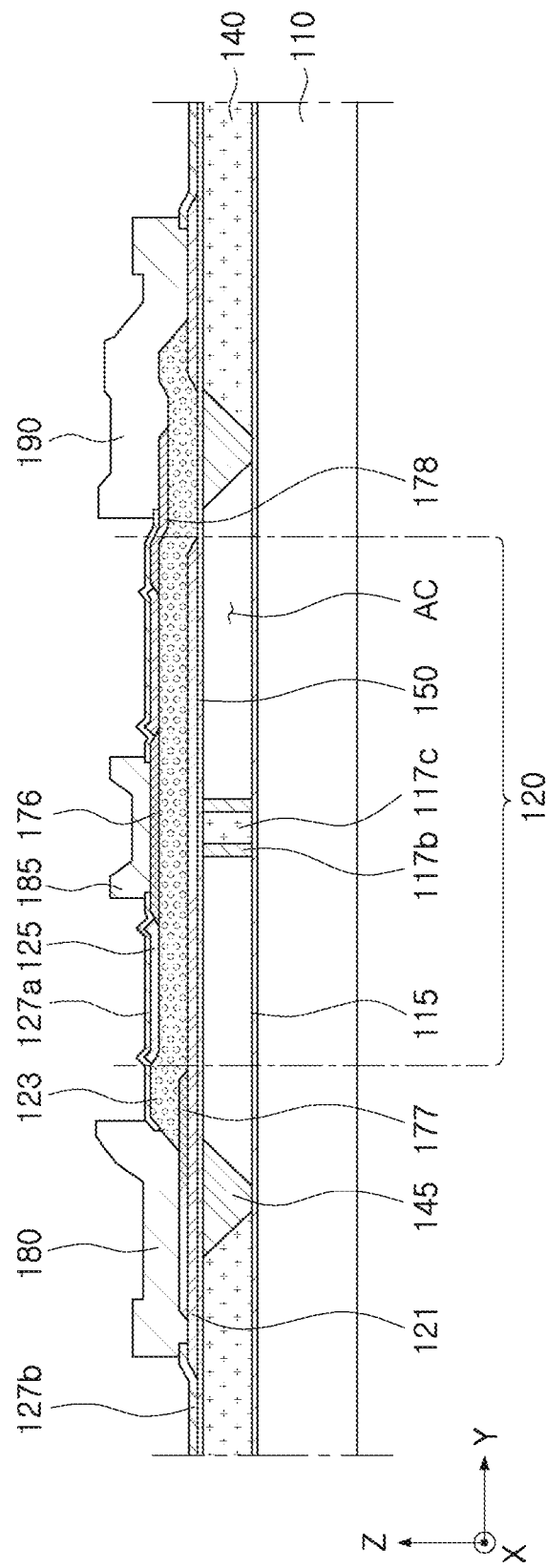

Referring to FIGS. 14D and 14E, at least a portion of the first metal insertion layer 176 may be disposed the pillar including the thermally conductive layer 117*c* and the intermediate metal layer 185, and may be disposed between the piezoelectric layer 123 and the intermediate metal layer 185.

Accordingly, the first metal insertion layer 176 may reflect vibrations of the piezoelectric layer 123 in the horizontal direction while improving the heat radiation performance of the intermediate metal layer 185.

As set forth above, an acoustic resonator disclosed herein is capable of reducing vibration leakage while ensuring heat radiation performance.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator, comprising:
a resonating unit including a piezoelectric layer and first and second electrodes disposed on a lower side and an upper side of the piezoelectric layer, respectively;
a substrate disposed on a lower side of the resonating unit;
a support unit providing a cavity between the substrate and the resonating unit; and
an intermediate metal layer separated from the second electrode and disposed in the resonating unit such that at least a portion thereof is surrounded by the piezoelectric layer and the second electrode.

2. The acoustic resonator of claim 1, further comprising a pillar disposed on a lower side of the intermediate metal layer in the cavity and connecting between the resonating unit and the substrate.

3. The acoustic resonator of claim 2, wherein the intermediate metal layer is electrically connected to the first electrode.

4. The acoustic resonator of claim 2, further comprising a first etch stop layer disposed between the support unit and the cavity,
wherein the pillar comprises,
a second etch stop layer disposed in the cavity and disposed between the resonating unit and the substrate; and
a thermally conductive layer surrounded by the second etch stop layer and formed of a material different from that of the second etch stop layer.

5. The acoustic resonator of claim 2, wherein the pillar is configured such that a width of a lower surface thereof is larger than a width of an upper surface thereof.

6. The acoustic resonator of claim 2, wherein the resonating unit further comprises a metal insertion layer disposed on a lower side of the intermediate metal layer and disposed between the pillar and the first electrode.

7. The acoustic resonator of claim 1, wherein the intermediate metal layer has a thickness thicker than a thickness of the second electrode.

8. The acoustic resonator of claim 1, wherein an interface between the intermediate metal layer and the piezoelectric layer is oblique to the first electrode.

9. The acoustic resonator of claim 8, wherein the resonating unit further comprises a first insertion layer in which at least a portion thereof is positioned between the intermediate metal layer and the first electrode.

10. The acoustic resonator of claim 1, wherein the resonating unit further comprises a first insertion layer surrounding at least a portion of the intermediate metal layer on an upper side of the piezoelectric layer.

11. The acoustic resonator of claim 1, wherein the resonating unit further comprises a first insertion layer in contact with the intermediate metal layer.

12. The acoustic resonator of claim 11, wherein the resonating unit further comprises a second insertion layer disposed further outwardly from the intermediate metal layer than the first insertion layer.

13. The acoustic resonator of claim 12, wherein at least one of the first and second insertion layers comprises a metal insertion layer.

14. The acoustic resonator of claim 1, further comprising a first metal layer in which at least a portion thereof is disposed on an upper side of the first electrode and electrically connected to the first electrode; and
a second metal layer in which at least a portion thereof is disposed on an upper side of the second electrode and electrically connected to the second electrode.

15. The acoustic resonator of claim 14, wherein the intermediate metal layer comprises the same material as the material of at least a portion of the first and second metal layers.

16. The acoustic resonator of claim 1, wherein the intermediate metal layer comprises a material different from that of the first and second electrodes.

17. An acoustic resonator, comprising:
a resonating unit including a piezoelectric layer, and first and second electrodes disposed on a lower side and an upper side of the piezoelectric layer, respectively;
a substrate disposed on a lower side of the resonating unit;
a support unit providing a cavity between the substrate and the resonating unit;
a pillar disposed in the cavity and connecting between the resonating unit and the substrate such that the pillar is surrounded by the cavity; and
an intermediate metal layer electrically connected to the second electrode and positioned on an upper side of the pillar.

18. The acoustic resonator of claim 17, wherein the intermediate metal layer is disposed on an upper surface of the second electrode.

19. The acoustic resonator of claim 17, further comprising a metal insertion layer in which at least a portion thereof is disposed between the intermediate metal layer and the pillar.

20. The acoustic resonator of claim 17, wherein at least a portion of the intermediate metal layer is surrounded by one or more of the piezoelectric layer and the first electrode layer.

21. An acoustic resonator, comprising:
a resonating unit including a piezoelectric layer, and first and second electrodes disposed on a lower side and an upper side of the piezoelectric layer, respectively;
a substrate disposed on a lower side of the resonating unit;
a support unit providing a cavity between the substrate and the resonating unit;
a pillar disposed in the cavity and connecting between the resonating unit and the substrate;
a first metal layer disposed on the first electrode and electrically connected to the first electrode;
a second metal layer disposed on the second electrode and electrically connected to the second electrode; and
an intermediate metal layer disposed on an upper side of the pillar and separated from the first and second metal layers.

* * * * *